US011967519B2

(12) United States Patent

Cao et al.

(10) Patent No.: US 11,967,519 B2
(45) Date of Patent: Apr. 23, 2024

(54) INTEGRATED SEMICONDUCTOR DEVICE AND METHOD FOR MANUFACTURING THE SAME

(71) Applicant: INNOSCIENCE (SUZHOU) SEMICONDUCTOR CO., LTD., Suzhou (CN)

(72) Inventors: Kai Cao, Suzhou (CN); Jianping Zhang, Suzhou (CN); Lei Zhang, Suzhou (CN); Weigang Yao, Suzhou (CN); Chunhua Zhou, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/437,031

(22) PCT Filed: May 11, 2021

(86) PCT No.: PCT/CN2021/093141

§ 371 (c)(1),
(2) Date: Sep. 7, 2021

(87) PCT Pub. No.: WO2022/236712

PCT Pub. Date: Nov. 17, 2022

(65) Prior Publication Data

US 2024/0014130 A1 Jan. 11, 2024

(51) Int. Cl.

*H01L 21/00* (2006.01)
*H01L 21/762* (2006.01)

(Continued)

(52) U.S. Cl.

CPC .. *H01L 21/76224* (2013.01); *H01L 21/76802* (2013.01); *H01L 23/49827* (2013.01);

(Continued)

(58) Field of Classification Search

CPC ............. H01L 23/528; H01L 21/76802; H01L 23/49827

See application file for complete search history.

(56) References Cited

U.S. PATENT DOCUMENTS

| | | | |
|---|---|---|---|
| 3,986,200 | A | 10/1976 | Allison |
| 5,712,509 | A | 1/1998 | Harada et al. |

(Continued)

FOREIGN PATENT DOCUMENTS

| | | | |
|---|---|---|---|
| CN | 101110402 | A | 1/2008 |
| CN | 103811461 | A | 5/2014 |

(Continued)

OTHER PUBLICATIONS

International Search Report and Written Opinion of the corresponding PCT application No. PCT/CN2021/093141 dated Feb. 15, 2022.

(Continued)

*Primary Examiner* — Laura M Menz
(74) *Attorney, Agent, or Firm* — McCoy Russell LLP

(57) ABSTRACT

An integrated semiconductor device includes a substrate, semiconductor circuit layers, a first insulating layer, a second insulating layer, and an interconnection layer. The semiconductor circuit layers are disposed above the substrate. The semiconductor circuit layers have device portions and isolating portions, and the isolating portions are located among the device portions. The first insulating layer is disposed on the semiconductor circuit layers, and the second insulating layer is disposed on the first insulating layer, and the interconnection layer is disposed on the semiconductor circuit layers. The interconnection layer penetrates the first and second insulating layers to electrically connect the device portions of the semiconductor circuit layers. The second insulating layer or the first and second insulating layers collectively form one or more isolating structures above the isolating portion of the semiconductor circuit (Continued)

layers. The interconnection layer has a plurality of first circuits located above the device portions.

20 Claims, 30 Drawing Sheets

(51) Int. Cl.

| | |
|---|---|
| ***H01L 21/768*** | (2006.01) |
| ***H01L 23/00*** | (2006.01) |
| ***H01L 23/498*** | (2006.01) |
| ***H01L 23/528*** | (2006.01) |
| ***H01L 29/20*** | (2006.01) |
| *H01L 29/66* | (2006.01) |
| *H01L 29/778* | (2006.01) |

(52) U.S. Cl.

CPC ........ *H01L 23/528* (2013.01); *H01L 23/5283* (2013.01); *H01L 24/05* (2013.01); *H01L 29/2003* (2013.01); *H01L 29/66462* (2013.01); *H01L 29/778* (2013.01); *H01L 2224/05556* (2013.01)

(56) References Cited

U.S. PATENT DOCUMENTS

| | | | | |
|---|---|---|---|---|
| 6,218,282 | B1 | 4/2001 | Buynoski | |
| 10,943,916 | B2 * | 3/2021 | Huo | H01L 21/76224 |
| 2008/0153252 | A1 | 6/2008 | Liu et al. | |
| 2013/0228897 | A1 * | 9/2013 | Chen | H01L 24/06 257/621 |
| 2014/0035109 | A1 * | 2/2014 | Volant | H01L 21/76802 257/621 |
| 2018/0138081 | A1 | 5/2018 | Wu et al. | |
| 2018/0261501 | A1 | 9/2018 | Tseng et al. | |
| 2019/0157288 | A1 * | 5/2019 | Huo | H10B 41/27 |
| 2021/0151457 | A1 * | 5/2021 | Huo | H10B 41/41 |
| 2022/0367246 | A1 * | 11/2022 | Cao | H01L 23/5283 |
| 2022/0376061 | A1 * | 11/2022 | Zhao | H01L 29/41775 |
| 2022/0376074 | A1 * | 11/2022 | Hao | H01L 29/475 |
| 2022/0393024 | A1 * | 12/2022 | Hao | H01L 29/7786 |
| 2023/0031259 | A1 * | 2/2023 | Cao | H01L 23/147 |
| 2023/0095367 | A1 * | 3/2023 | Zhao | H01L 27/085 257/192 |

FOREIGN PATENT DOCUMENTS

| | | | | | |
|---|---|---|---|---|---|
| CN | 103811465 | A | | 5/2014 | |
| CN | 106611761 | A | | 5/2017 | |
| CN | 108288609 | A | | 7/2018 | |
| CN | 109037266 | B | * | 12/2020 | G09F 9/33 |
| CN | 113016074 | A | * | 6/2021 | H01L 21/56 |
| CN | 113439340 | A | * | 9/2021 | H01L 29/2003 |
| CN | 113519064 | A | * | 10/2021 | H01L 29/2003 |
| CN | 114127914 | A | * | 3/2022 | |
| CN | 114207835 | A | * | 3/2022 | |
| CN | 114270533 | A | * | 4/2022 | H01L 21/8252 |
| CN | 114556561 | A | * | 5/2022 | |
| CN | 114597173 | A | * | 6/2022 | |
| CN | 114127914 | B | * | 5/2023 | |
| CN | 116864505 | A | * | 10/2023 | |
| JP | 2016035948 | A | | 3/2016 | |
| KR | 20090002644 | A | | 1/2009 | |
| KR | 20200086918 | A | | 7/2020 | |
| WO | WO-2022174400 | A1 | * | 8/2022 | H01L 21/56 |
| WO | WO-2022174562 | A1 | * | 8/2022 | H01L 21/8252 |
| WO | WO-2023015493 | A1 | * | 2/2023 | |
| WO | WO-2023015495 | A1 | * | 2/2023 | |
| WO | WO-2023039746 | A1 | * | 3/2023 | |
| WO | WO-2023082058 | A1 | * | 5/2023 | |
| WO | WO-2023082071 | A1 | * | 5/2023 | |
| WO | WO-2023082202 | A1 | * | 5/2023 | |
| WO | WO-2023102744 | A1 | * | 6/2023 | H01L 23/3171 |
| WO | WO-2023141749 | A1 | * | 8/2023 | |

OTHER PUBLICATIONS

State Intellectual Property Office of the People's Republic of China, Office Action and Search Report Issued in Application No. 202180004425.8, Jan. 18, 2023, 13 pages. (Submitted with Machine Translation).

* cited by examiner

INTEGRATED SEMICONDUCTOR DEVICE AND METHOD FOR MANUFACTURING THE SAME

FIELD OF THE DISCLOSURE

The present disclosure generally relates to a semiconductor device. More specifically, the present disclosure relates to an integrated semiconductor device with trenches form between circuits.

BACKGROUND OF THE DISCLOSURE

In recent years, nitride semiconductor device such as high-electron-mobility transistors (HEMTs) are prevalent in developments in semiconductor technologies and devices such as high power switching and high frequency applications. These devices utilize a heterojunction interface between two materials having different bandgaps, and electrons are accumulated at the interface and form a two-dimensional electron gas (2DEG) region, which satisfies demands of high power/frequency devices. In addition to HEMTs, examples of devices having heterostructures further include heterojunction bipolar transistors (HBT), heterojunction field effect transistor (HFET), and modulation-doped FETs (MODFET).

Since the size and integration of nitride semiconductor devices have progressed enormously, densities of electrical connections on the devices have increased as well, and gaps between the electrical connections are reduced. At present, there is a need to improve the yield rate of the connection of nitride devices, thereby making them suitable for mass production.

SUMMARY OF THE INVENTION

In accordance with one aspect of the present disclosure, an integrated semiconductor device with one or more trenches located between circuits is provided. The integrated semiconductor device includes a substrate, a plurality of semiconductor circuit layers, a first insulating layer, a second insulating layer, and an interconnection layer. The semiconductor circuit layers are disposed above the substrate. The semiconductor circuit layers have a plurality of device portions and one or more isolating portions, and the isolating portions are located among the device portions. The isolating portions provide electrical isolation between adjacent said device portions. Some of the semiconductor circuit layers form at least one heterojunction.

In the above disclosure, the first insulating layer is disposed on the semiconductor circuit layers, and the second insulating layer is disposed on the first insulating layer, and the interconnection layer is disposed on the semiconductor circuit layers. The interconnection layer penetrates the first and second insulating layers to electrically connect the device portions of the semiconductor circuit layers. The second insulating layer or the first and second insulating layers collectively form one or more trenches above the isolating portion of the semiconductor circuit layers. The interconnection layer has a plurality of first circuits located above the device portions.

In an embodiment of the present disclosure, each trench includes side walls. The side walls of the trenches have continuous profiles.

In an embodiment of the present disclosure, a width of the trench is decreasing towards a bottom portion of the trench in the first insulating layer.

In an embodiment of the present disclosure, a width of the trench is increasing towards a bottom portion of the trench in the first insulating layer.

In an embodiment of the present disclosure, the first insulating layer and the second insulating layer collectively form a stepped sidewall over the isolating portions. A width of the trench in the first insulating layer is smaller than a width of the trench in the second insulating layer.

In an embodiment of the present disclosure, at least one of the isolating portions is exposed from the corresponding one of the trenches.

In an embodiment of the present disclosure, the first insulating layer forms bottom portions of the trenches.

In an embodiment of the present disclosure, the first circuits have a first portion within the first insulating layer and a second portion within the second insulating layer. The second portion is wider than the first portion. An interface between the first circuit and the second insulating layer and a side wall of the trench in the second insulating layer are parallel.

In an embodiment of the present disclosure, the integrated semiconductor device further includes a protection layer and a plurality of conductive pads. The conductive pads are disposed on the second insulating layer and the interconnection layer with the protection layer. The protection layer and the second insulating layer or the protection layer and the first and second insulating layers collectively form the trenches above the isolation portion.

In an embodiment of the present disclosure, the second insulating layer forms bottom portions of the trenches.

In an embodiment of the present disclosure, the protection layer and the second insulating layer form a plurality of columns above each isolation portion.

In an embodiment of the present disclosure, the projections of two of the conductive pads and the trench therebetween on the substrate has aligned top sides and bottom sides.

In an embodiment of the present disclosure, the trenches have a rectangular shape viewed along a normal vector of a carrier surface of the substrate.

In an embodiment of the present disclosure, materials of the semiconductor circuit layers include III-V semiconductors. Materials of the semiconductor circuit layers form the heterojunction include gallium nitride.

In accordance with another aspect of present disclosure, a semiconductor apparatus including integrated semiconductor device having trenches form in insulating layers and circuit board having holes is provided. The semiconductor apparatus includes at least one of the above-mentioned integrated semiconductor device, and a circuit board. The circuit board includes an insulating board, and a plurality of vias.

In the above disclosure, the circuit board electrically connects the integrated semiconductor device. The insulating board of the circuit board has a plurality of holes, and the vias are disposed in the holes respectively. The circuit board electrically connects the first circuits of the integrated semiconductor device through the vias.

In an embodiment of the present disclosure, the insulating board of the circuit board includes one or more isolating structures. The isolating structures are corresponded to the isolating portions of the semiconductor circuit layers of the integrated semiconductor device.

In accordance with another aspect of present disclosure, a manufacturing method of an integrated semiconductor device including forming trenches on insulating layer is provided. The method of manufacturing method of an integrated semiconductor device includes: providing a substrate and semiconductor circuit layers disposed thereon; providing a first insulating layer on the semiconductor circuit layers; providing a first insulating layer on the semiconductor circuit layers; providing an interconnection layer on the device portions of the semiconductor circuit layers; providing a second insulating layer on the first insulating layer; and forming one or more trenches above isolating portions of the semiconductor circuit layers. Some of the semiconductor circuit layers form at least one heterojunction. The isolating portions are positioned among the device portions to electrically insulate device portions from one another.

In an embodiment of the present disclosure, the formation of the trenches creates wider openings in the first insulating layer and narrower openings in the second insulating layer.

In an embodiment of the present disclosure, the formation of the trenches creates narrower openings in the first insulating layer and wider openings in the second insulating layer.

In an embodiment of the present disclosure, the formation of the trenches creates opening in the first insulating layer having the same width as opening in the second insulating layer.

In accordance with another aspect of the present disclosure, an integrated semiconductor device having indented surface is provided. The integrated semiconductor device includes a substrate, one or more semiconductor circuit layers, a plurality of first circuits, and at least one insulating material. The semiconductor circuit layers are disposed above the substrate. The semiconductor circuit layers have a plurality of device portions and one or more isolating portions, and the isolating portions are located among the device portions. The isolating portions provide isolation between adjacent device portions. The first circuits are disposed on the device portions of the semiconductor circuit layers. The insulating material is disposed among the first circuits. Some of the semiconductor circuit layers form at least one heterojunction. The insulating material form an indented surface above every isolating portion of the semiconductor circuit layers.

In an embodiment of the present disclosure, a first insulating layer and a second insulating layer form the insulating material. The first insulating layer is disposed on the semiconductor circuit layer, and the second insulating layer is disposed on the first insulating layer.

In an embodiment of the present disclosure, top surfaces of the insulating material on the device portions are aligned with top surfaces of the insulating material on the isolating portions such that a continuous, planar surface is formed.

In an embodiment of the present disclosure, a projection of bottoms the insulating material on the isolating portions of the semiconductor circuit layers separate the first circuits in different device portions. The bottoms of the insulating material are at the same level.

In an embodiment of the present disclosure, the insulating material has a plurality of trenches, and the trenches form the indented surface.

By applying such configuring above, the presence of the trenches in the insulating layers advantageously improves the connection of the integrated semiconductor device. In the integrated semiconductor device, the trenches can prevent electromigration between different circuits of the integrated semiconductor device.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
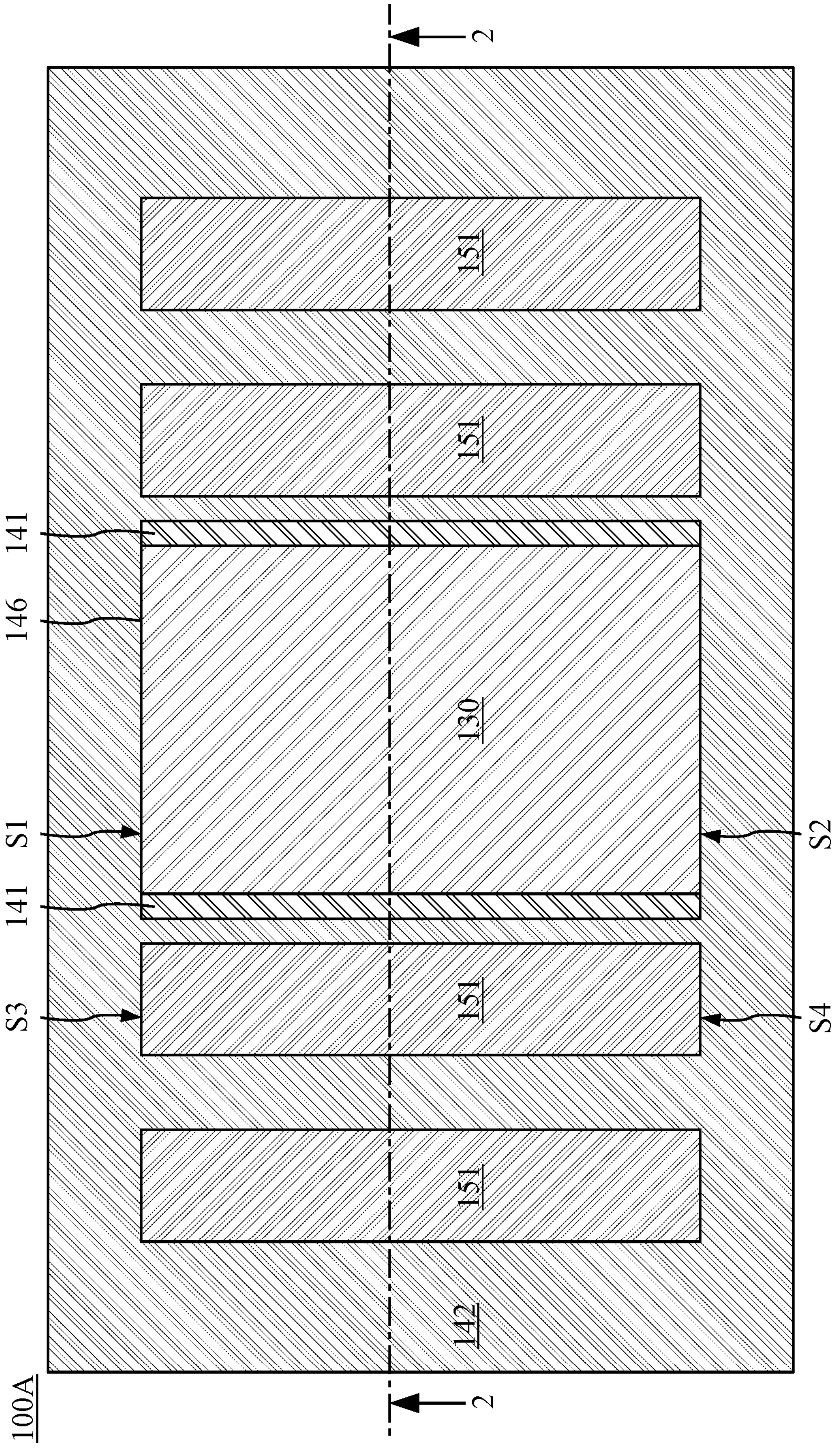
FIG. 1 is a top view of an integrated semiconductor device according to an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above", "below", "up", "left", "right", "down", "top", "bottom", "vertical", "horizontal", "side", "higher", "lower", "upper", "over", "under", and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of present disclosure are not deviated from such arrangement.

In the following description, integrated semiconductor devices, methods for manufacturing the same, and the like are set forth as preferred examples. It will be apparent to those skilled in the art that modifications, including additions or substitutions may be made without departing from the scope and spirit of the disclosure. Specific details may be omitted so as not to disclosure the invention; however, the disclosure is written to enable one skilled in the art to practice the etching herein without under experimentation.

Figure 2:
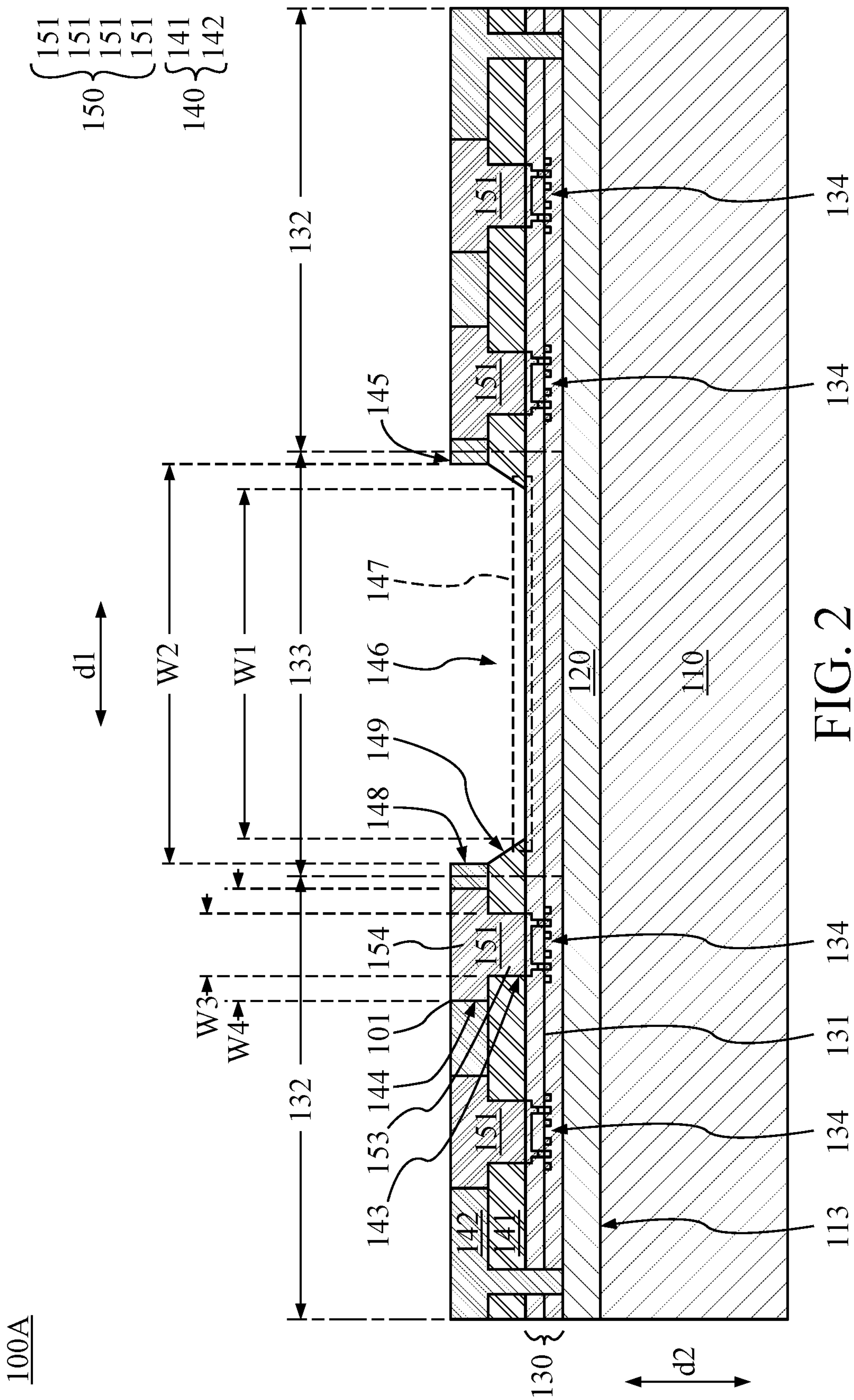
FIG. 2 is a side sectional view of the integrated semiconductor device taken along the cutting plan line 2 in FIG. 1.
Figure 3:
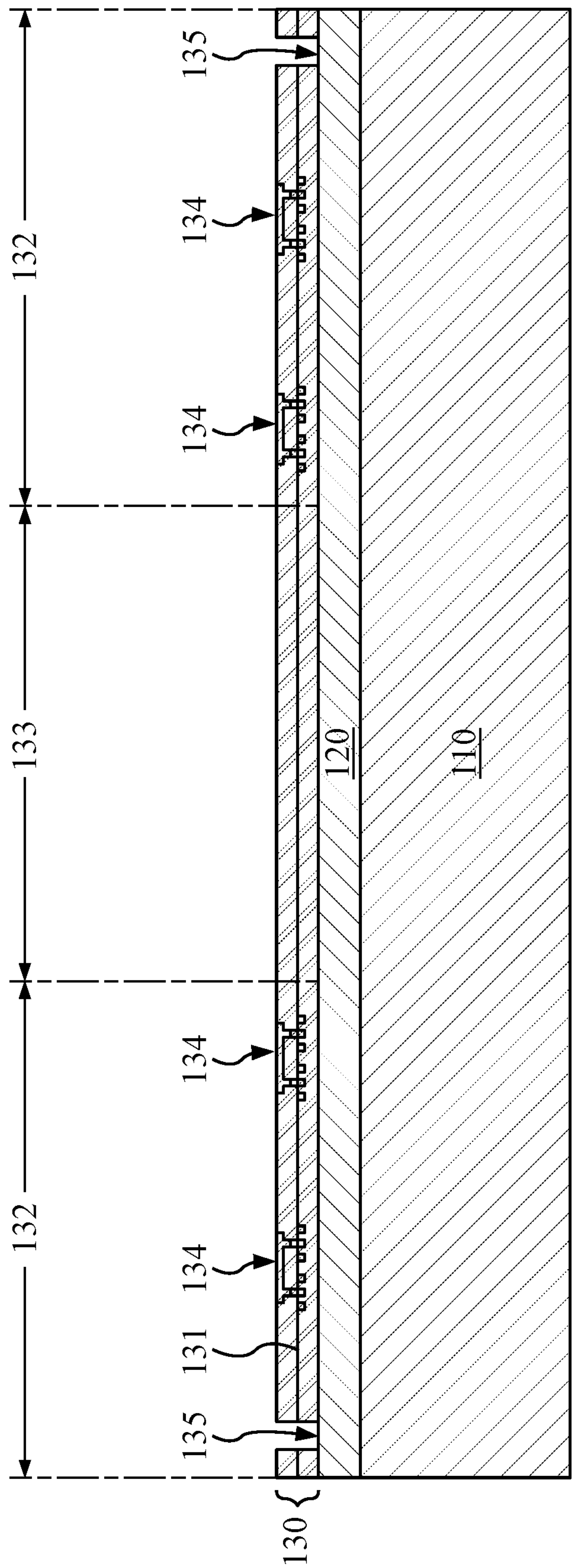
FIGS. 3, 4, 5, 6, and 7 depict steps of a manufacturing method of an integrated semiconductor device according to another embodiment of the present disclosure.

FIG. 1 is a top view of an integrated semiconductor device 100A according to an embodiment of the present disclosure, and FIG. 2 is a side sectional view of the integrated semiconductor device 100A taken along the cutting plan line 2 in FIG. 1. Please refer to FIG. 1 and FIG. 2, in the embodiment of the present disclosure, the integrated semiconductor device 100A may include a transistor 134. Furthermore, for example, the integrated semiconductor device 100A may include a field-effect transistor such as high-electron-mobility transistor (HEMT) 134, but the present disclosure is not limited thereto. The integrated semiconductor device 100A includes a substrate 110, a plurality of semiconductor circuit layers 130, an insulating layer 141, an insulating layer 142, and an interconnection layer 150.

In this embodiment, the semiconductor circuit layers 130 are disposed above the substrate 110, and some of the semiconductor circuit layers 130 form at least one heterojunction 131. For example, one of the semiconductor circuit layers 130 may include gallium nitride (GaN), and another one may include aluminum gallium nitride (AlGaN), and the heterojunction 131 may form therebetween, and the HEMT 134 may be formed in the semiconductor circuit layers 130.

Furthermore, materials of the semiconductor circuit layers 130 may include III-V semiconductors, and materials of the semiconductor circuit layers 130, which form the heterojunction 131, may include gallium nitride or aluminum gallium nitride. However, the present disclosure is not limited to the materials of the semiconductor circuit layers 130, other material can be included in some embodiments of the present disclosure.

The semiconductor circuit layers 130 have a plurality of device portions 132 and an isolating portion 133. The isolating portion 133 is located between the device portions 132. In some embodiment, the semiconductor circuit layers 130 may include more isolating portions 133, and the isolating portions 133 are located among the device portions 132. The isolating portions 133 provide electrical isolation between adjacent said device portions 132.

Also, the integrated circuit device 100A may include an epitaxial layer 120. The epitaxial layer 120 is disposed on the substrate 110, and the semiconductor circuit layers 130 are disposed on the epitaxial layer 120. For example, a material of the substrate 110 may include silicon. In other embodiments of the present disclosure, a material of the substrate 110 may include gallium nitride (GaN), silicon carbide (SiC), or glass. A material of the epitaxial layer 120 may include gallium nitride (GaN). In other embodiment of the present disclosure, the epitaxial layer 120 and the substrate 110 may be silicon on insulator (SOI).

The insulating layer 141 is disposed on the semiconductor circuit layers 130, and the insulating layer 142 is disposed on the insulating layer 141, and the interconnection layer 150 is disposed on the semiconductor circuit layers 130. The insulating layers 141, 142 and the interconnection layer 150 are all disposed on the semiconductor circuit layers 130 and the area of substrate 110 where no semiconductor circuit layers 130 are disposed, and the interconnection layer 150 is embedded in the insulating layers 141, 142. The insulating layer 141 is located between the insulating layer 142 and the substrate 110.

In the embodiment, the insulating layer 141 has openings 143, and the insulating layer 142 has openings 144, which are corresponded to the openings 143 respectively. The interconnection layer 150 is disposed in the openings 143, 144. Therefore, the interconnection layer 150, which is embedded in the insulating layers 141, 142, penetrates the insulating layers 141, 142 to electrically connect the device portions 132 of the semiconductor circuit layers 130. In the embodiment, the HEMT of the semiconductor circuit layers 130 may located in the device portions 132, and the interconnection layer 150 may electrically connect the HEMT in the device portions 132. To be specific, the interconnection layer 150 of the embodiment has a plurality of circuits 151 located above the device portion 132.

In the embodiment, the insulating layers 141, 142 collectively form trench 146 above the isolating portion 133 of the semiconductor circuit layers 130. In some embodiments of the present disclosure, the insulating layer 142 itself may form the trench 146. Also, the number of the trench 146 in the embodiment is not limited to the referred figured, the semiconductor circuit layers 130 may have a plurality of isolating portions 133, and the insulating layers 141, 142 may form the trenches 146 above the isolating portions 133 respectively.

The integrated semiconductor device 100A has trench 146 being disposed between the device portions 132, and migrating distance between the circuits 151 in different device portions 132 is increased, and electromigration may be prevented by the trench 146. Also, along the direction d1, the circuits 151 can be distributed with higher density, and the circuits 151 may keep nice electrical connection.

In this embodiment, the insulating layers 141, 142 form insulating material 140, and the insulating material 140 is disposed among the circuits 151. The insulating material 140 form an indented surface 145 above every isolating portion 111 of the semiconductor circuit layers 130. Therefore, the length along the surface of the insulating material 140 between the circuits 151 from different device portions 132 is increased by the trench 146, and the indented surface 145 can avoid electromigration.

A projection of bottoms the insulating material 140 on the isolating portions 133 of the semiconductor circuit layers 130 separate the first circuits 151 in different device portions 132. The bottoms of the insulating material 140 are at the same level.

In this embodiment, a width of the trench 146 is decreasing towards a bottom portion 147 of the trench 146 in the insulating layer 141. In this embodiment, a width W1 of the bottom portion 147 of the trench 146 in the insulating layer 141 is smaller than a width W2 of the top side of the trench 146 in the insulating layer 142.

A side wall 148 of the trench 146 in the insulating layer 142 is vertical, and the side wall 148 is extending along a direction d2. The direction d2 is at right angle to the carrier surface 113 of the substrate 110.

A side wall 149 of the trench 146 in the insulating layer 141 is tilted, and the side wall 149 is tilted toward the center of the bottom portion 147 of the trench 146.

In this embodiment, the circuit 151 has portion 153 within the insulating layer 141 and portion 154 within the insulating layer 142. The portion 154 is wider than the portion 153. An interface 101 between the circuit 151 and the insulating layer 142 and the side wall 148 of the trench 146 in the insulating layer 142 are parallel.

To be specific, the interface 101 and the side wall 148 are parallel, and the side wall 148 and the interface 101 are at right angle to the carrier surface 113 of the substrate 110. A gap between the interface 101 and the side wall 148 can be defined, and the electromigration can be avoided by defining the gap with proper width.

Please refer to FIG. 1, in the embodiment, the projection of the trench 146 on the carrier surface 113 of the substrate 110 (as shown in FIG. 2) has a rectangular shape. In other words, the trench 146 have a rectangular shape viewed along a normal vector of a carrier surface 113 of the substrate 110 (as shown in FIG. 2).

The projections of the trench 146 and the circuits 151 on the carrier surface 113 of the substrate 110 (as shown in FIG. 2) have aligned top sides S1, S3 and bottom sides S2, S4. To be specific, the projection of the top side S3 of each of the circuits 151 and the top side S1 of the trench 146 are aligned, and the bottom side S4 of each of the circuits 151 and the bottom side S2 of the trench 146 are aligned.

However, the present disclosure is not limited thereto. In some embodiments of the present disclosure, the top side S1 of the trench 146 can be higher than the top side S3 of the circuit 151, and the bottom side S2 of the trench 146 can be lower than the bottom side S4 of the circuit 151. In other words, the trench 146 can be extended longer than the circuits 151.

In the embodiment of the present disclosure, the insulating layers 141, 142 may include dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc.), or combinations thereof.

The isolating structure (e.g., trench 146) may be fabricated by using suitable techniques including photolithography and etching processes. In particular, the photolithography and etching processes may comprise depositing a commonly used mask material such as photoresist over the insulating layer 142, exposing the mask material to a pattern, etching the insulating layer 142 and the insulating layer 141 in accordance with the pattern. In this manner, the trench 146 may be formed as a result.

To be specific, the formation of the trench 146 creates narrower opening in the insulating layer 141 and wider opening in the insulating layer 142. In other words, the shape of the cross-section of the opening in the insulating layer 141 is a trapezoid.

Also, the circuits 151 of the interconnection layer 150 may include metal or metal compound. The exemplary materials of the metals or metal compounds can include, for example but are not limited to, W, Au, Pd, Ti, Ta, Co, Ni, Pt, Mo, TiN, TaN, metal alloys thereof, or other metallic compounds.

As seen above, the integrated semiconductor device 100A of the embodiment has trench 146, and the trench 146 is formed on the isolating portion 133. Therefore, the electrical isolation between the device portions 132 is enhanced. The following are description of a manufacturing method of an integrated semiconductor device of an embodiment of the present disclosure, and the description refers to multiple drawing, so as to explain different steps of the manufacturing method.

FIGS. 3, 4, 5, 6, and 7 are side sectional views depicting a manufacturing method of the integrated semiconductor device 100B of an embodiment of the present disclosure. Please refer to FIG. 3, the manufacturing method provides a substrate 110 and a plurality of semiconductor circuit layers 130. Some of the semiconductor circuit layers 130 form heterojunction 131. For example, one of the semiconductor circuit layers 130 may contain GaN, and another one of the semiconductor circuit layers 130 may contain AlGaN, and the heterojunction 131 is formed therebetween.

Also, a plurality of transistors 134 are formed in the semiconductor circuit layers 130. For example, the semiconductor circuit layers 130 form the sources, drains, and the gates of the transistors 134. Moreover, separating openings 135 can be form in the semiconductor circuit layers 130 through etching.

In this embodiment, the transistors 134 are distributed in the device portions 132 of the semiconductor circuit layers 130, and no transistors 134 is disposed in the isolating portion 133 of the semiconductor circuit layers 130. Therefore, the isolating portions 133 are positioned among the device portions 132 to electrically insulate device portions 132 from one another.

Figure 4:
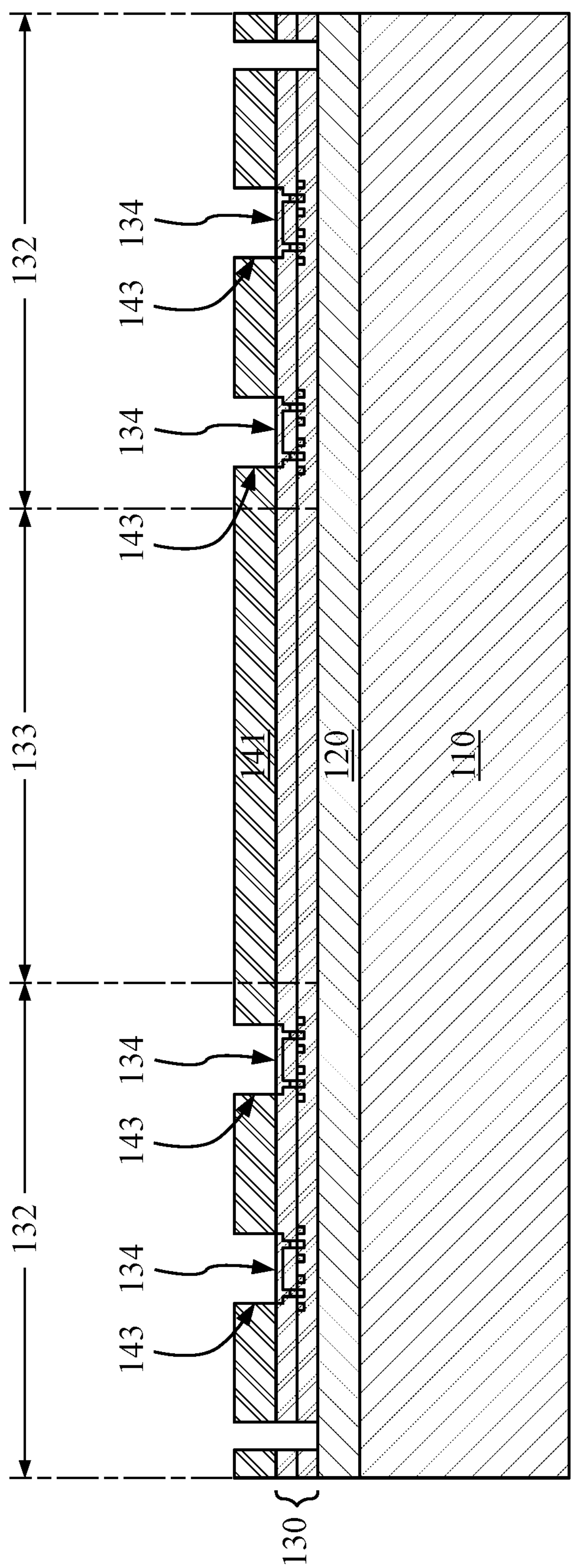

Referring to FIG. 4, the manufacturing method provides an insulating layer 141 on the semiconductor circuit layers 130. To be specific, the insulating layer 141 may include openings 143, and the openings 143 are corresponded to the transistors 134. In other words, the insulating layer 141 exposes the transistors 134 in the semiconductor circuit layers 130.

In this embodiment, the openings 143 are located in the device portions 132, and the isolating portion 133 of the semiconductor circuit layers 130 are covered by the insulating layer 143.

Figure 5:
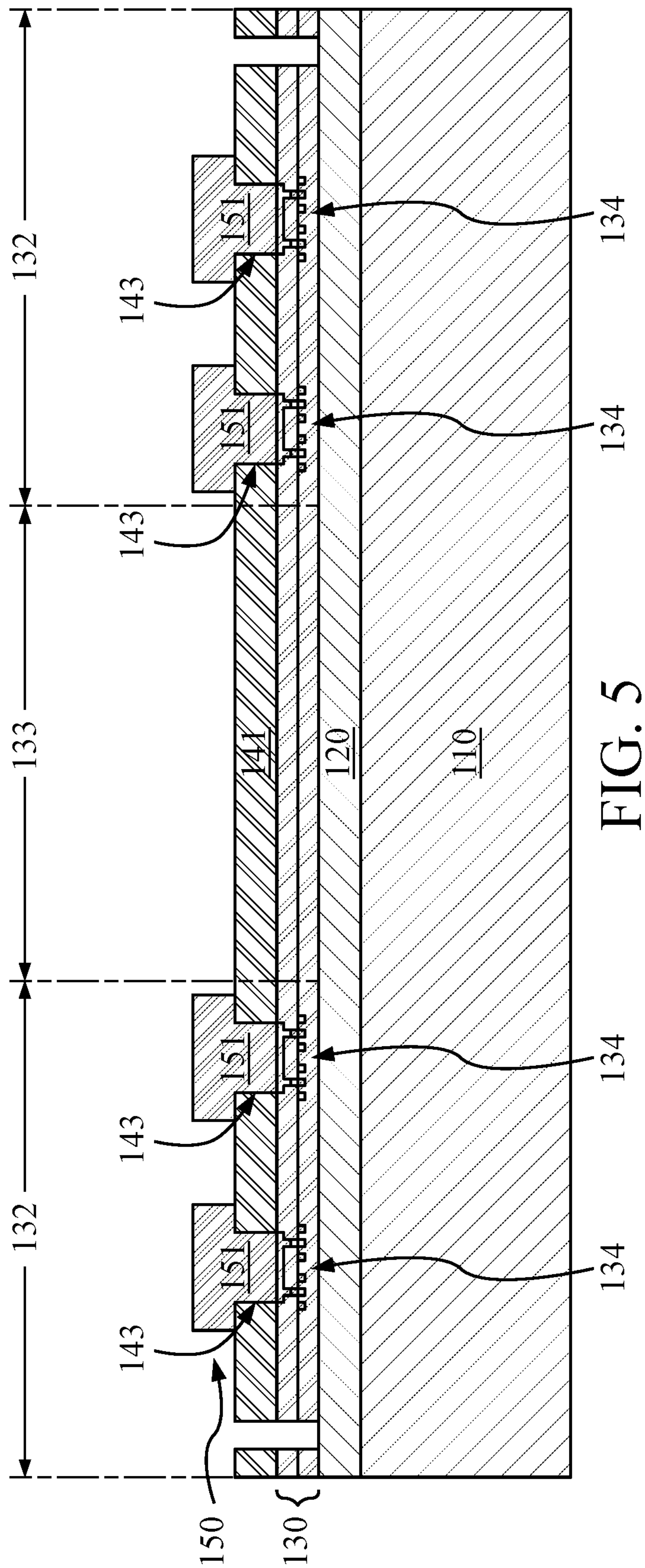

Referring to FIG. 5, the manufacturing method provides an interconnection layer 150 on the device portions 132 of the semiconductor circuit layers 130. In the embodiment, the interconnection layer 150 has a plurality of circuits 151, and every circuit 151 is disposed in one of the openings 143. Each of the circuits 151 is electrically connected to one of the transistors 134.

Figure 6:
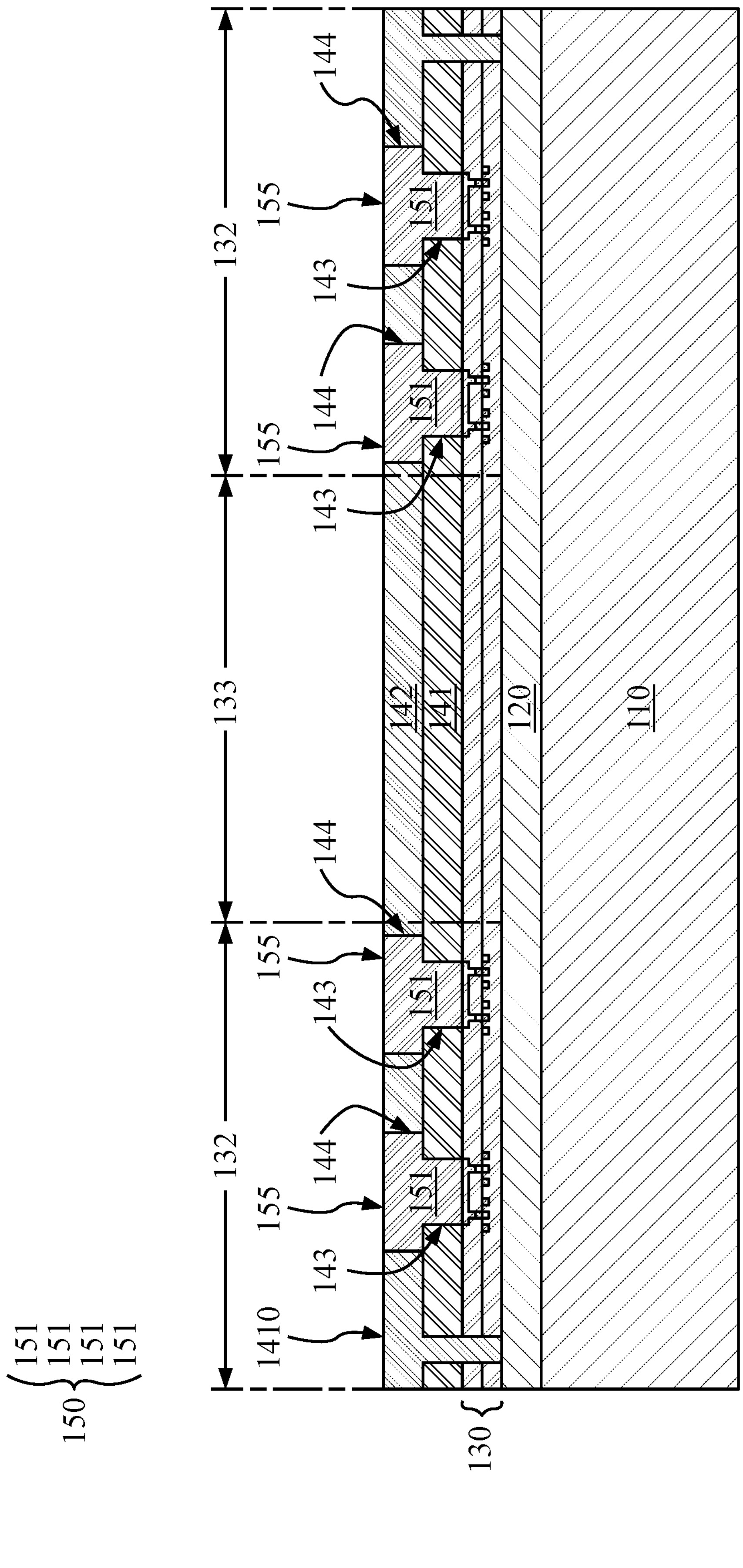

Referring to FIG. 6, the manufacturing method provides an insulating layer 142 on the insulating layer 141. The insulating layer 141 fill the gaps between the circuits 151, and part of the circuits 151 are disposed in the openings 144 of the insulating layer 142.

In this embodiment, top surface 1410 of the insulating layer 142 and top surfaces 155 of the circuits are coplanar, and no top surface 155 is present in the isolating portion 133. Moreover, the insulating layer 141 and the insulating layer 142 form an insulating material 140, and the top surface 1410 of the insulating material 140 on the device portion 132 are aligned with top surface 1414 of the insulating material 140 on the isolating portion 133, such that a continuous, planar surface is formed.

Figure 7:
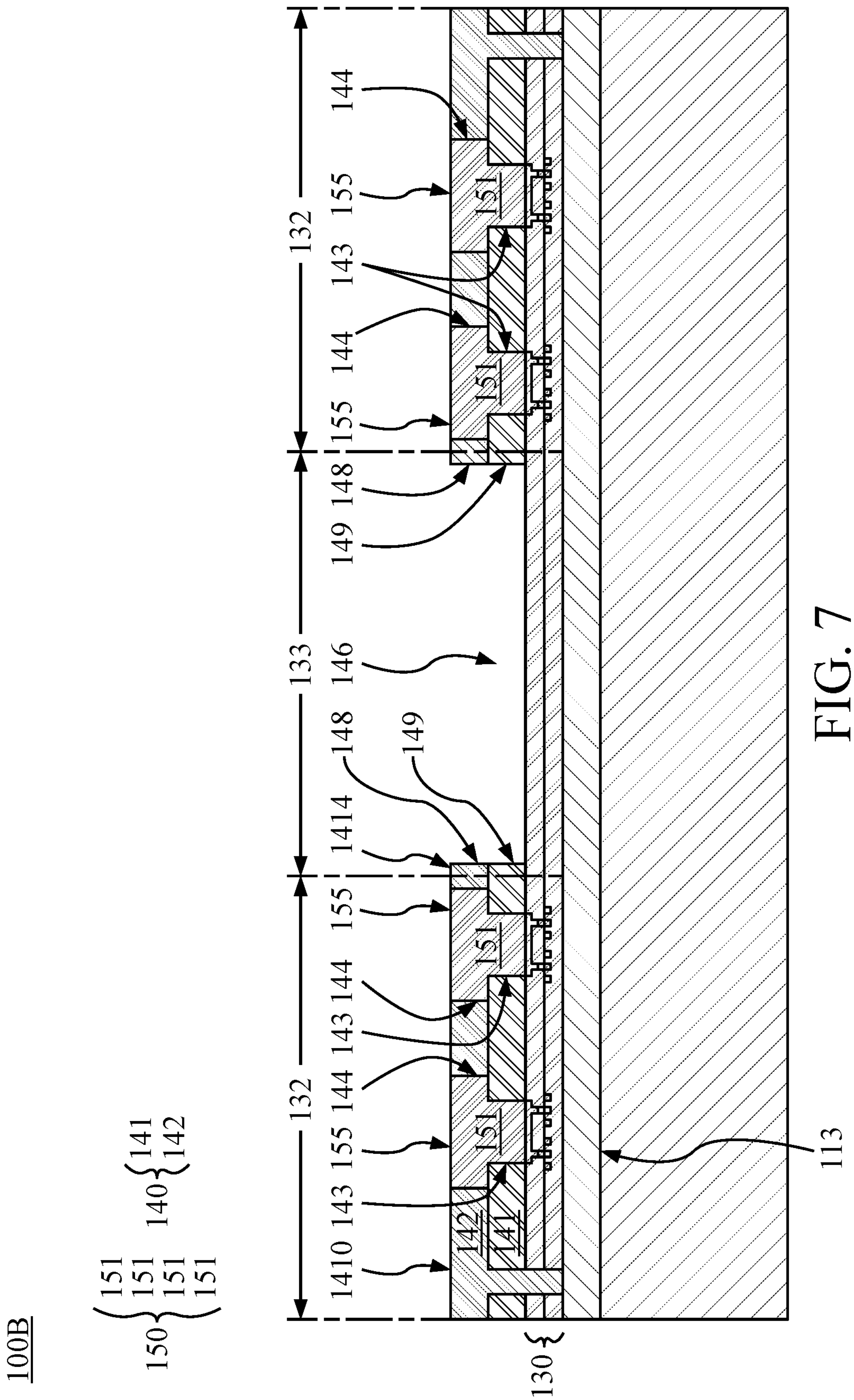

Referring to FIG. 7, the manufacturing method form trench 146 above the isolating portion 133 of the semiconductor circuit layers 130, and the integrated semiconductor device 100B is formed.

The trench 146 is concave from the top surfaces 1410 of the insulating layer 142. Therefore, while measuring along the surface, the distance between the circuits 151 on different device portions 132 is extended by the trench 146, and the electromigration may be prevented.

In one aspect, the shape or the structure of the trench in the integrated semiconductor device of the present disclosure is not limited to the trench 146 of the integrated semiconductor device 100A of the above embodiment. In this embodiment, the trench 146 in the integrated semiconductor layer 100B includes side walls 148, 149. The side walls 148, 149 of the trench 146 have continuous profiles.

To be specific, the side walls 148 and the side walls 149 are coplanar, and the side walls 148 and the side walls 149 are at right angle to the carrier surface 113 of the substrate 110.

To be specific, the side wall 149 of the trench 146 and side wall of the opening 143 are parallel, and the side wall 148 of the trench 146 and side wall of the opening 144 are parallel. Therefore, the trench 146 can be formed through one etching process.

For example, the formation of the trench 146 creates opening in the insulating layer 141 having the same width as opening in the insulating layer 142. In other words, the openings in the insulating layers 141, 142 both have a rectangular shape.

Also, the isolating portion 133 of the semiconductor circuit layers 130 is exposed from the trench 146. The insulating layers 141, 142 on the isolating portion 133 are etched, and the trench 146 passes through the insulating layer 141 and the insulating layer 142. In other words, the isolating portion 133 of the semiconductor circuit layers 130 form the bottom of the trench 146, and the insulating layers 141, 142 form the side walls 149, 148 of the trench 146.

Figure 8:
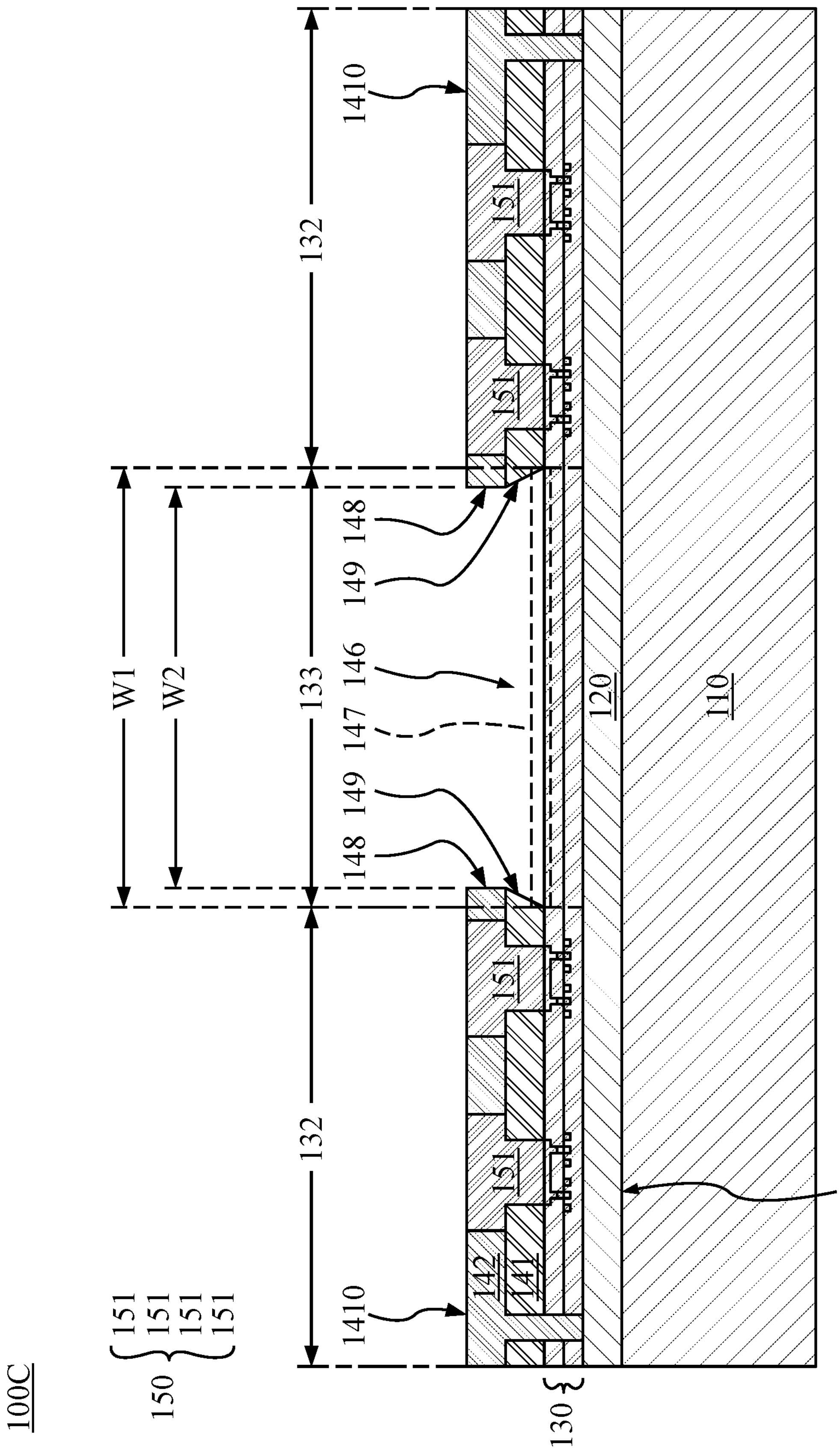
FIG. 8 is a side sectional view of an integrated semiconductor device of some embodiment of the present disclosure.

FIG. 8 is another side sectional view of an integrated semiconductor device 100C of some embodiments of the present disclosure. In this embodiment, the width of the trench 146 of the integrated semiconductor device 100C may increase towards the bottom.

Please refer to FIG. 8, an integrated semiconductor device 100C includes a substrate 110, semiconductor circuit layers 130, insulating layers 141, 142, and an interconnection layer 150 embedded in the insulating layers 141, 142. Furthermore, an epitaxial layer 120 may disposed on the substrate 110, and the semiconductor circuit layers 130 are disposed on the epitaxial layer 120.

A trench 146 is formed in the insulating layers 141, 142. To be specific, the trench 146 is located on the isolating portion 133 of the semiconductor circuit layers 130, and the circuits of the interconnection layer 150 are located on the device portions 133 of the semiconductor circuit layers 130.

The trench 146 in the insulating layer 142 has a width W2, and a bottom portion 147 of the trench 146 in the first insulating layer 141 has a width W1. The width W1 is longer than the width W2. Therefore, the width of the trench 146 is increasing towards the bottom portion 147.

In one aspect, the formation of the trench 146 creates wider opening in the insulating layer 141 and narrower opening in the insulating layer 142.

In this embodiment, an opening of the trench 146 on the top surface 1410 of the insulating layer 142 is small, which can be formed between the circuits 151 which are close to each others, and the widen bottom portion 147 can still increase the electromigration distance therebetween, which can prevent the occurrence of electromigration. For example, the trench 146 of the integrated semiconductor device 100C can be formed by isotropic etching such as wet etching, and the etchants may widen the trench 146 in the isolating layer 141.

Figure 9:
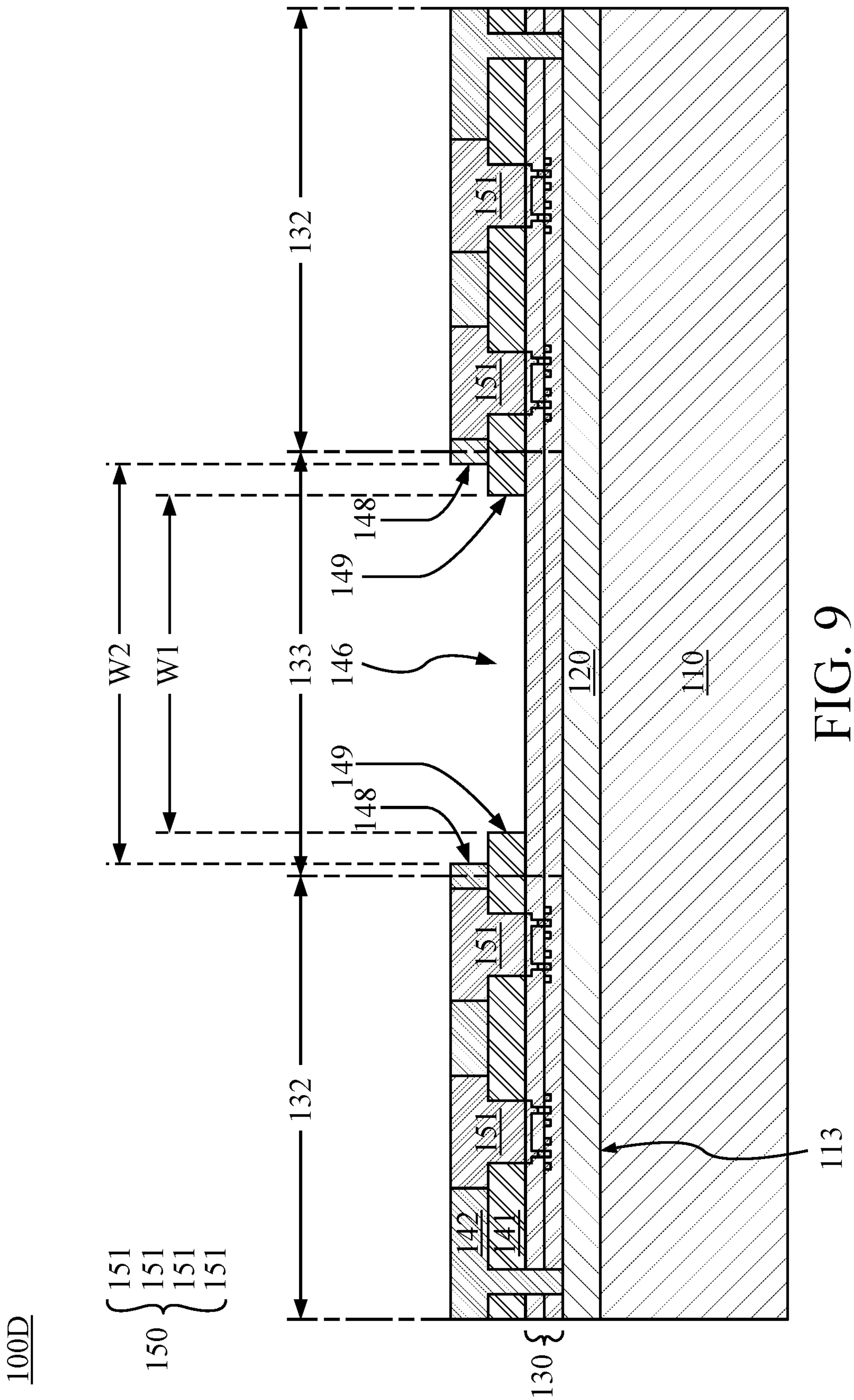
FIG. 9 is a side sectional view of an integrated semiconductor device of some embodiment of the present disclosure.

FIG. 9 is still another side sectional view of an integrated semiconductor device 100D of some embodiments of the present disclosure. In this embodiment, the trench 146 of the integrated semiconductor device 100D has a stepped sidewall.

Please refer to FIG. 9, the integrated semiconductor device 100D is similar to the integrated semiconductor device 100C, which includes a substrate 110, an epitaxial layer 120, a semiconductor circuit layers 130, an insulating layer 141, an insulating layer 142, and an interconnection layer 150. The interconnection layer 150 has a plurality of circuits 151, which are embedded in the insulating layer 141 and the insulating layer 142.

In this embodiment, the circuits 151 are located on the device portions 132, and the trench 146 is located on the isolating portion 133. The sidewall 149 of the trench 146 in the insulating layer 141 has a width W1, and the sidewall 148 of the trench 146 in the insulating layer 142 has a width W1. The width W1 is smaller than the width W2, and the sidewall 149 is protruded from the sidewall 148. Therefore, the sidewall 149 in the insulating layer 141 and the sidewall 148 in the insulating layer 142 can form a stepped sidewall.

To be specific, the trench 146 of the integrated semiconductor device 100D can formed through two different etching processes.

Figure 10:
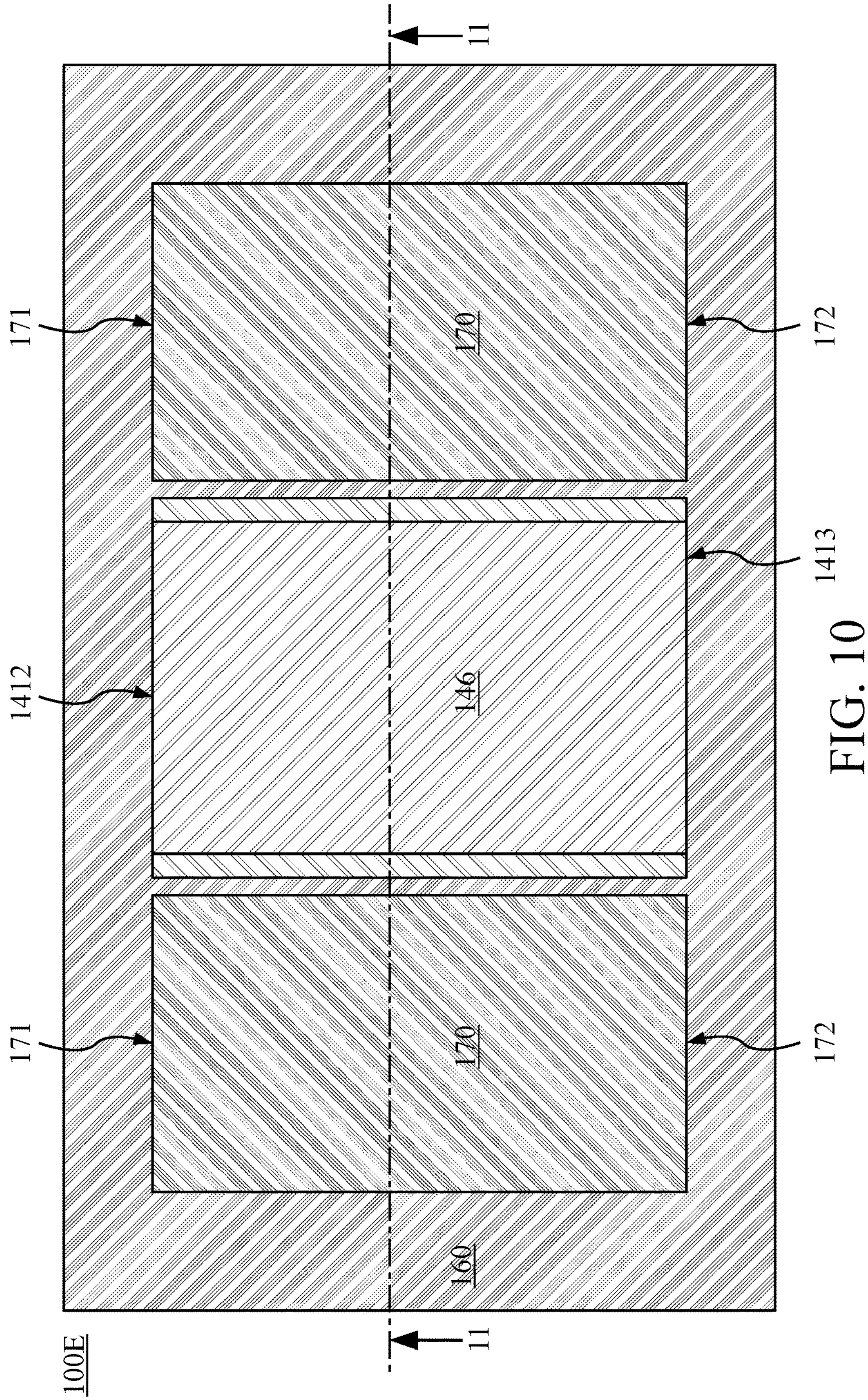
FIG. 10 is a top view of an integrated semiconductor device according to some embodiments of the present disclosure.
Figure 11:
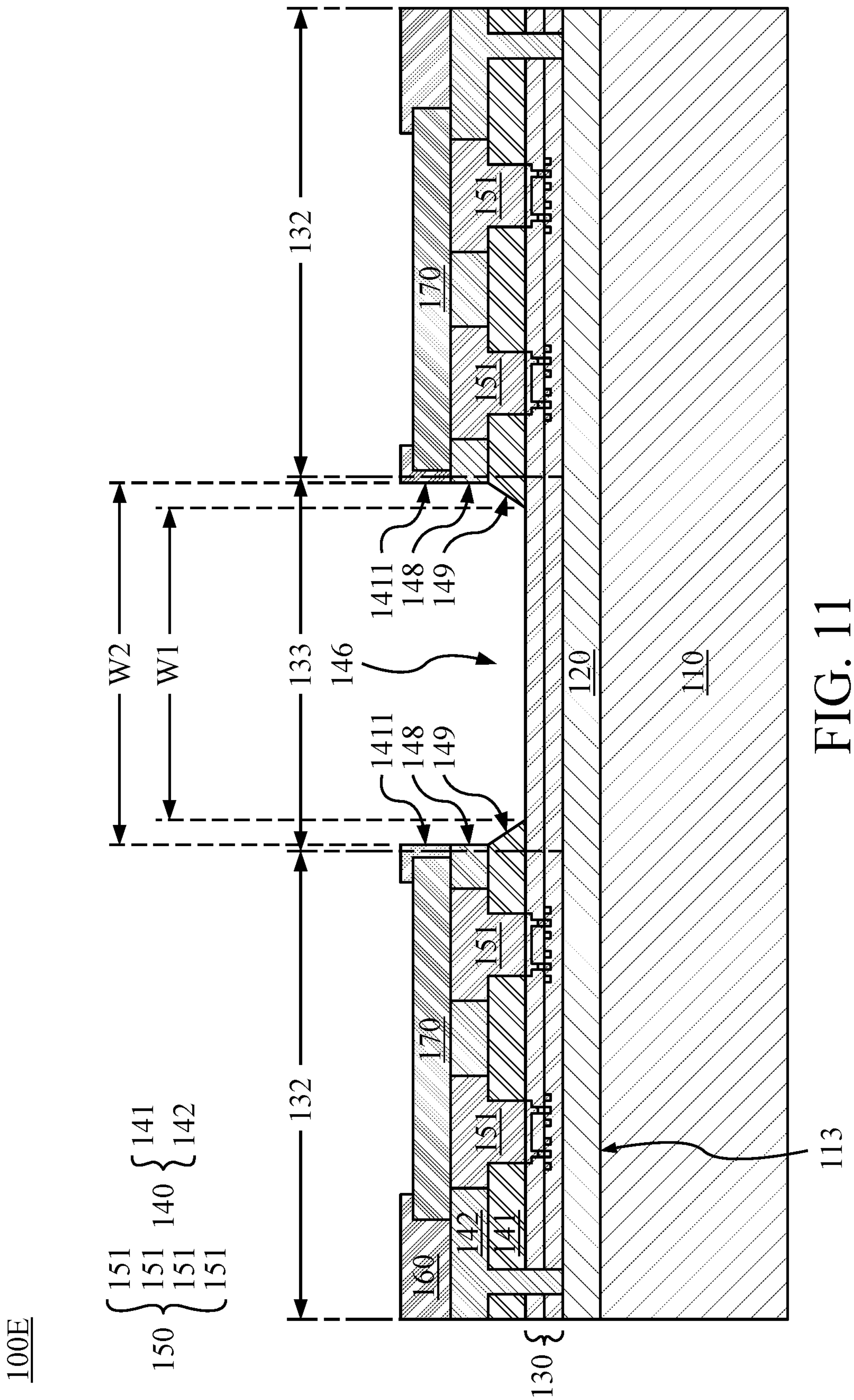
FIG. 11 is a side sectional view of the integrated semiconductor device taken along the cutting plan line 11 in FIG. 10.

FIG. 10 yet another top view of an integrated semiconductor device 100E of some embodiments of the present disclosure, and FIG. 11 is a side sectional view of the integrated semiconductor device 100E taken along cutting plane line 11. Please refer to FIG. 10 and FIG. 11, in this embodiment, the integrated semiconductor device 100E includes a substrate 110, an epitaxial layer 120, a semiconductor circuit layers 130, an insulating material 140, and an interconnection layer 150.

The semiconductor circuit layers 130 are disposed above the substrate 110. The semiconductor circuit layers 130 have device portions 132 and one isolating portion 133, and the isolating portion 133 is located among the device portions 132. The isolating portions 133 provide isolation between adjacent device portions 132. The circuits 151 are disposed on the device portions 132 of the semiconductor circuit layers 130. The insulating material 140 is disposed among the circuits 151. The insulating material 140 form an indented surface above every isolating portion 133 of the semiconductor circuit layers 130.

To be specific, the insulating material 140 has a trench 146, and, therefore, the indented surface is formed. However, the trench 146 of the integrated semiconductor device 100E is different from the trenches of the embodiments above.

In this embodiment, the integrated semiconductor device 100E further includes a protection layer 160 and a plurality of conductive pads 170.

Materials of the protection layer 160 of the embodiment may include dielectric materials. For example, the exemplary dielectric materials can include, for example but are not limited to, one or more oxide layers, a $SiO_x$, layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc.), or combinations thereof. In other embodiment, the dielectric materials can include, for example but are not limited to, epoxy, liquid photo-imageable solder mask (LPSM or LPI) inks, dry-film photo-imageable solder mask (DF SM).

Materials of the conductive pads 170 of the embodiment may include metal or metal compound. The exemplary materials of the metals or metal compounds can include, for example but are not limited to, W, Au, Pd, Ti, Ta, Co, Ni, Pt, Mo, TiN, TaN, metal alloys thereof, or other metallic compounds.

The conductive pads 180 are disposed on the insulating layer 142 and the interconnection layer 150 with the protection layer 160. Moreover, the conductive pads 180 are embedded in the protection layer 160.

In this embodiment, the protection layer 160, the insulating layer 142, and the insulating layer 141 collectively form the trench 146 above the isolation portion 133.

Moreover, in the trench 146, the side wall 148 in the insulating layer 142 and the side wall 1411 in the protection layer 160 are coplanar. The side wall 148 and the side wall 1411 are at right angle to the carrier surface 113 of the substrate 110. The side wall 149 in the insulating layer 141 is tilted, and the side wall 149 is tilting towards the center of the trench 146.

In one aspect, the width of the trench 146 is reducing towards the bottom. At the bottom of the insulating layer 141, the trench 146 has a width W1, and the trench 146 in the insulating layer 142 and the protection layer 150 have a width W2, and the width W2 is larger than the width W1.

Referring to FIG. 10, the projection of two of the conductive pads 170 and the trench 146 therebetween on the substrate 110 has aligned top sides and bottom sides. To be specific, the top sides 171 of the projection of the conductive pads 170 are aligned with the top side 1412 of the projection of the trench 146. The bottom sides 172 of the projection of the conductive pads 170 are aligned with bottom side 1413 of the projection of the trench 146. Therefore, the trench 146 can electrically isolate the conductive pads 170 and the circuits 151 thereunder.

Referring to FIG. 11, in the trench 146, the shape of the opening in the insulating layer 141 is a trapezoid, and the opening in the insulating layer 142 and the protection layer 160 have a rectangular shape.

In this embodiment, the protection layer 160 and the trench 146 can further increase distance between the conductive pads 170 along the surface, so as to prevent electromigration.

Figure 12:
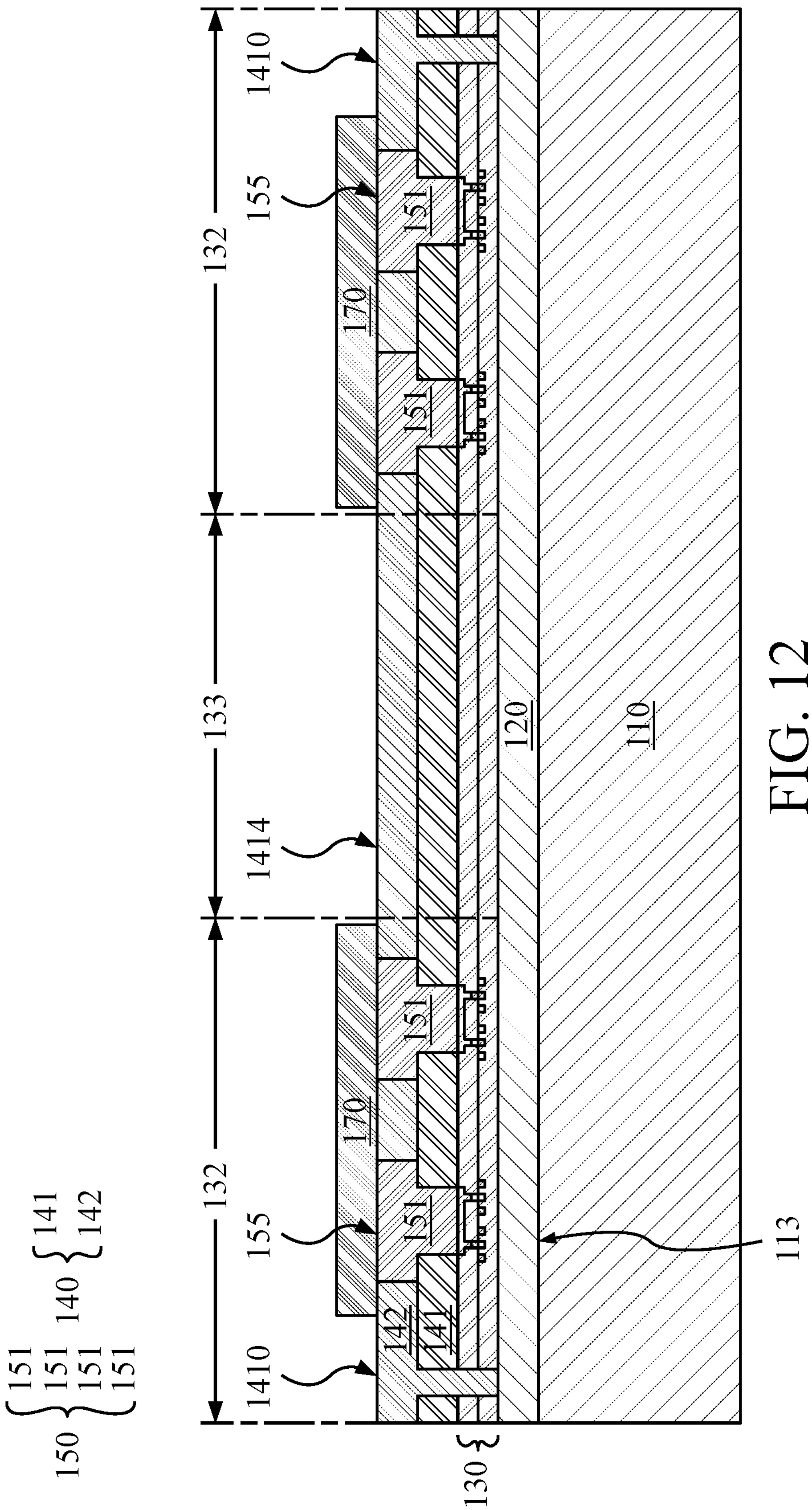
FIGS. 12, 13, and 14 depict steps of a manufacturing method of an integrated semiconductor device according to another embodiment of the present disclosure.
Figure 13:
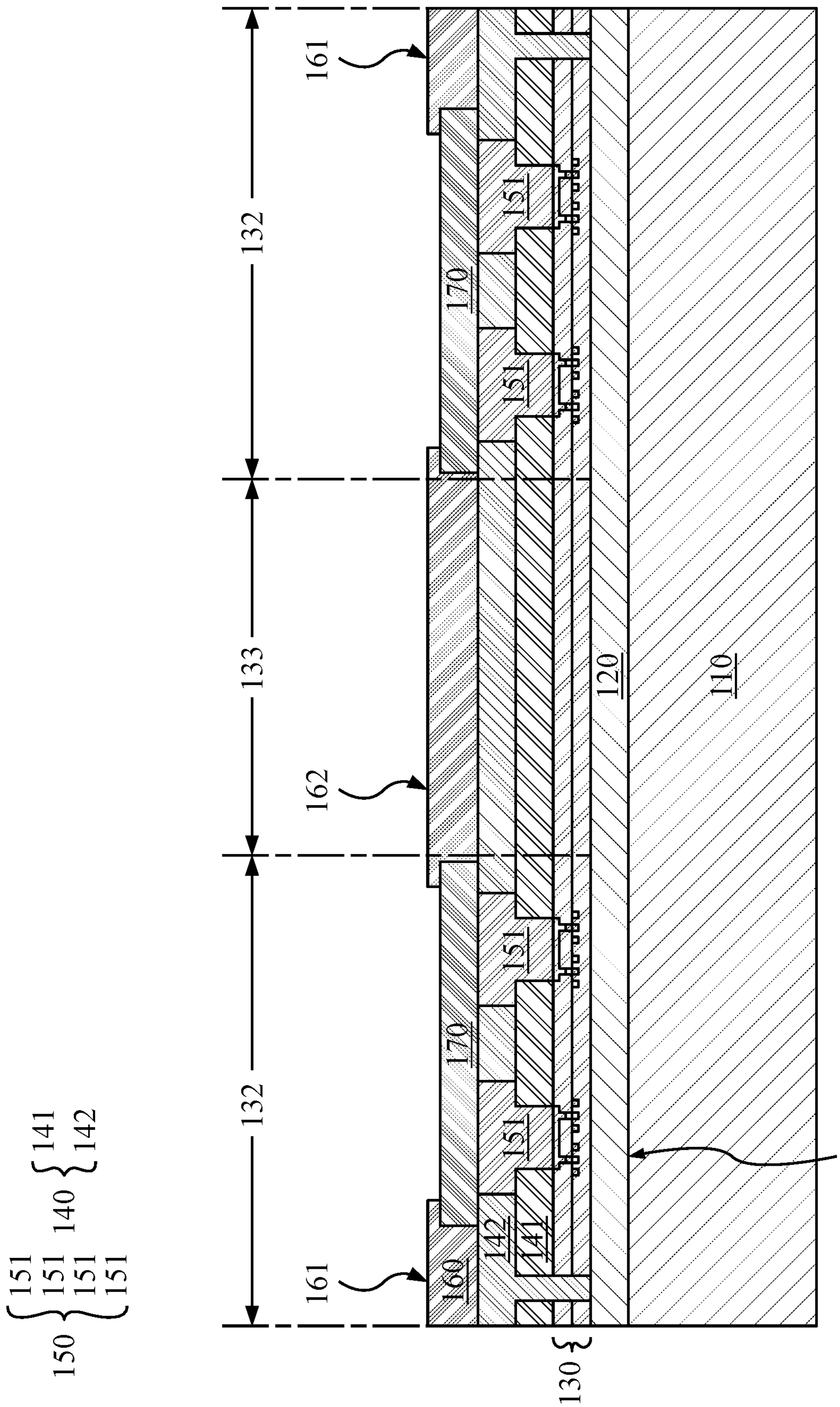
Figure 14:
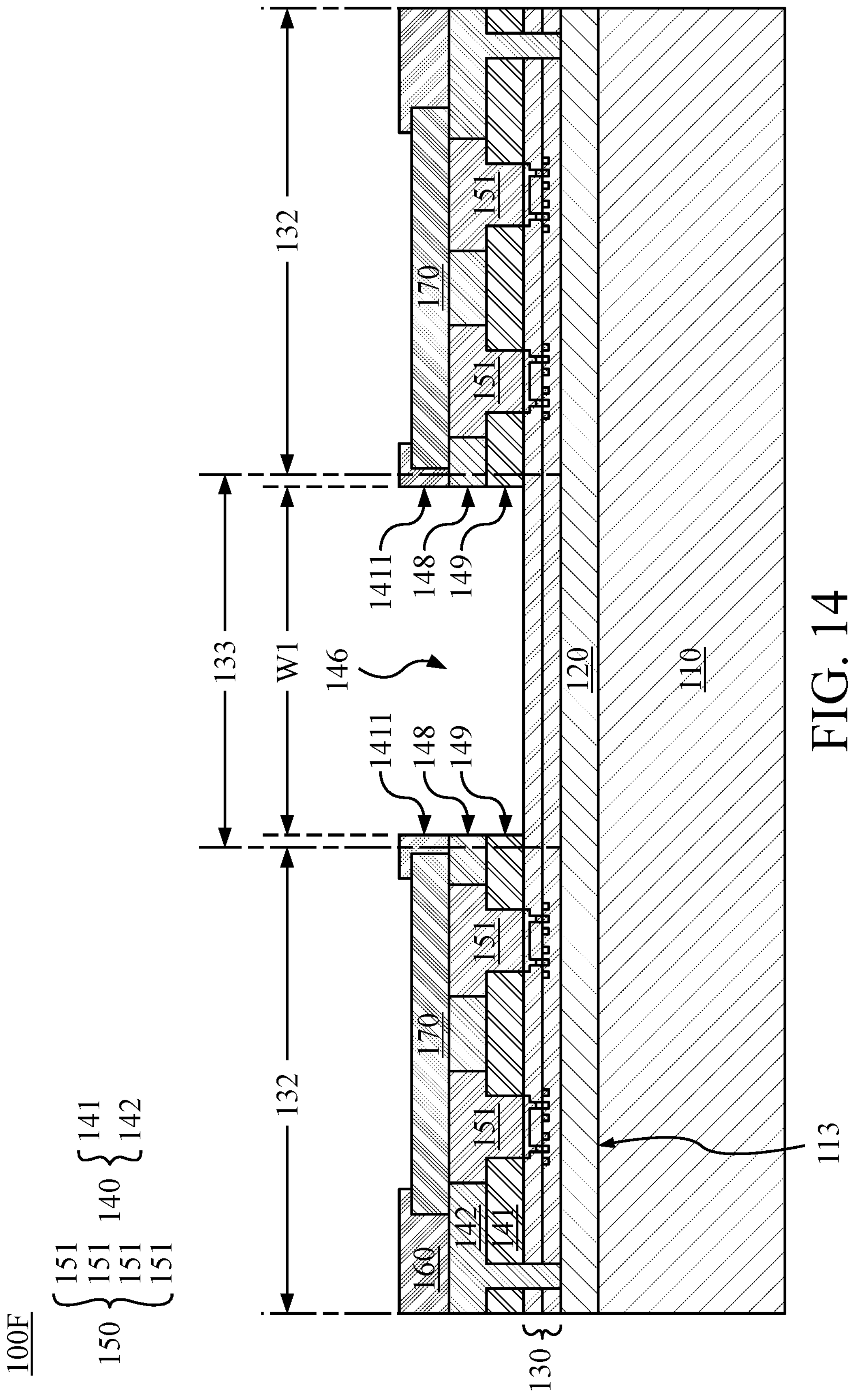

FIGS. 12, 13, and 14 are side sectional views depicting a manufacturing method of the integrated semiconductor device 100F of an embodiment of the present disclosure.

Referring to FIG. 12, the epitaxial layer 120 is disposed on the substrate 110, and the semiconductor circuit layers 130 are disposed on the epitaxial layer 120, and the insulating material 140 is disposed on the semiconductor circuit layers 130. The circuits 151 of the interconnection layer 150 are embedded in the insulating layer 141 and the insulating layer 142 of the insulating material 140.

The top surface 1410 of the insulating layer 142 on the device portion 132, the top surfaces 155 of the circuits 151, and the top surface 1414 of the insulating layer 142 on the insulating portion 133 are coplanar.

The manufacturing method of this embodiment disposes conductive pads 170 on the device portions 132, and every conductive pad 170 may cover top surfaces 155 of multiple circuits 151 and top surface 1410 of the insulating layer 142.

Referring to FIG. 13, a protection layer 160 is disposed on the insulating layer 142. The conductive pads 170 are embedded in the protection layer 160.

In this embodiment, the top surface 161 of the protection layer 160 on the device portion 132 and the top surface 162 of the protection layer 160 on the isolating portion 133 are coplanar.

On the isolating portion 133, two insulating layers 141, 142, and the protection layer 160 are stacked on the semiconductor circuit layer 130.

Referring to FIG. 14, a trench 146 is formed in the insulating layers 141, 142, and the protection layer 160. The trench 146 is formed by etching the protection layer 160 and the insulating layers 141, 142.

In this embodiment, the width of the trench 146 is the same. To be specific, the side wall 149 of the trench 146 in the insulating layer 141, the side wall 148 of the trench 146 in the insulating layer 142, and the side wall 1411 of the trench 146 in the protection layer 160 are coplanar. Also, in the trench 146, the openings in the insulating layer 141, insulating layer 142, and the protection layer 160 have the same width W1.

The trench 146 of the embodiment can be formed through single etching process.

Figure 15:
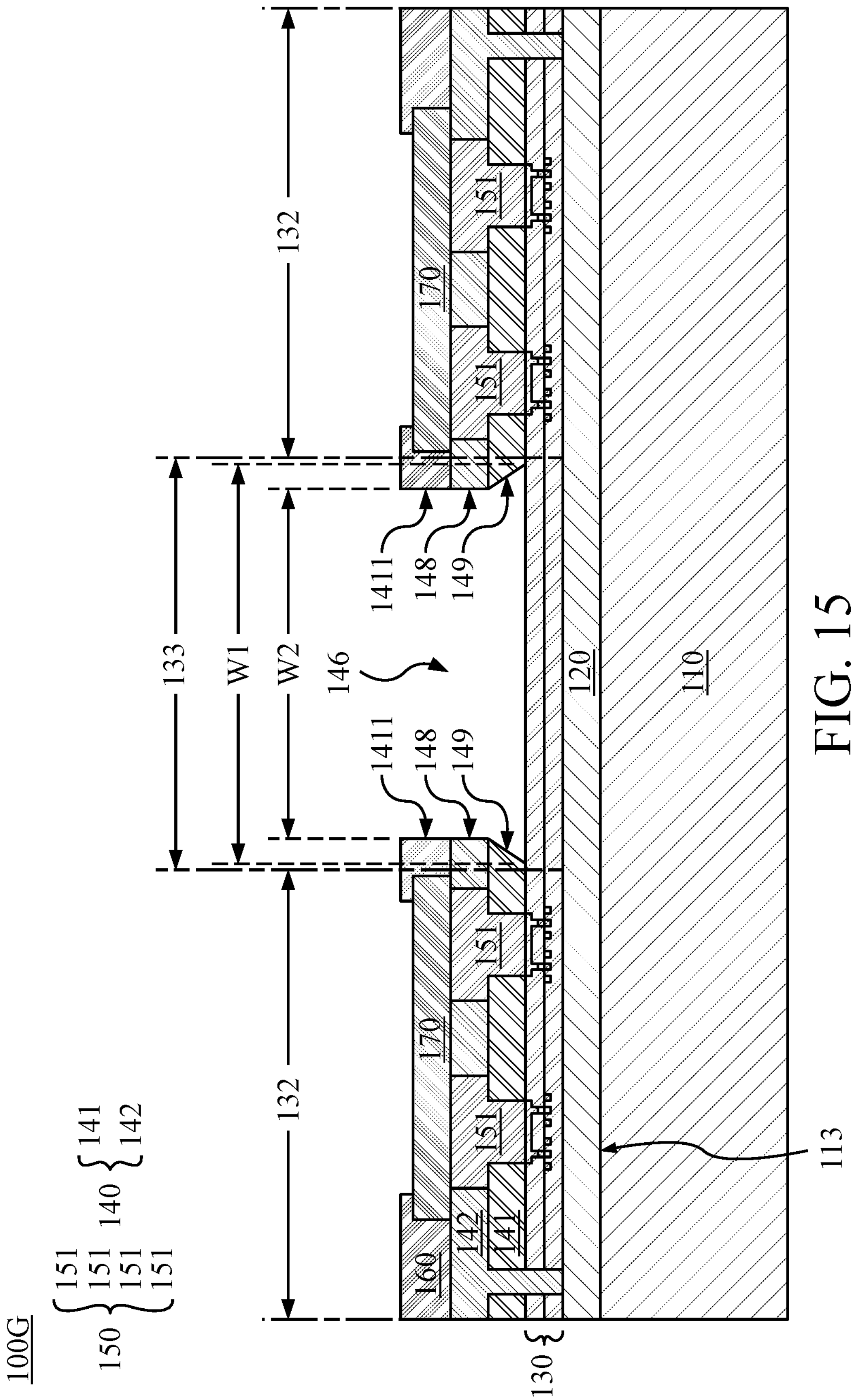
FIG. 15 is a side sectional view of an integrated semiconductor device of some embodiment of the present disclosure.

FIG. 15 is a side sectional view of an integrated semiconductor device 100G of another embodiment of the present disclosure. In this embodiment, the width of the trench 146 of the integrated semiconductor device 100G is increasing towards its bottom.

The bottom of the trench 146 is formed by the semiconductor circuit layers 130. The side wall 149 of the trench 146 in the insulating layer 141 is tilted, and, therefore, the bottom of the trench 146 has width W1, and the top of the opening in the insulating layer 141 has width W2, and the width W2 is smaller than the width W1.

The side wall 148 of the trench 146 in the insulating layer 142 and the side wall 1411 of the trench 146 in the protection layer 160 are coplanar. The side wall 149 of the insulating layer 141 is tilting outward, and, therefore, the trench 146 can prevent electromigration.

Figure 16:
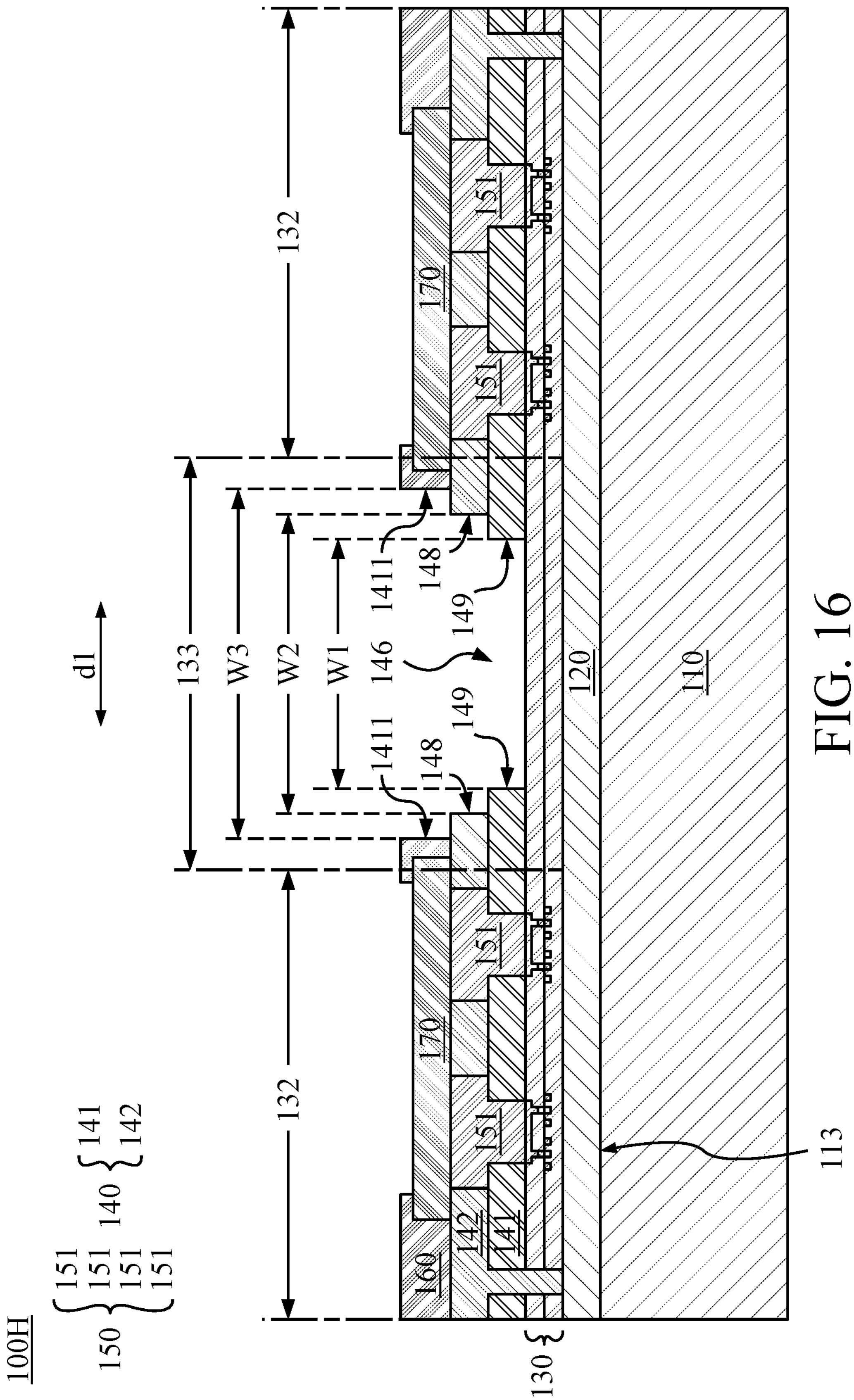
FIG. 16 is a side sectional view of an integrated semiconductor device of some embodiment of the present disclosure.

FIG. 16 is a side sectional view of an integrated semiconductor device 100H of still another embodiment of the present disclosure. In this embodiment, the trench 146 has stepped side wall.

The insulating layer 141 is disposed on the semiconductor circuit layers 130, and the opening of the insulating layer 141 has a width W1. The insulating layer 142 is disposed on the insulating layer 141, and the opening of the insulating layer 142 has a width W2.

On direction d1, which is perpendicular to normal vector of the carrier surface 113 of the substrate 110, the distance between the side wall 148 and the circuit 151 is smaller than the distance between the side wall 149 and the circuit 151.

The protection layer 160 is disposed on the insulating layer 142, and the opening of the protection layer 160 has a width W3. The width W3 is larger than the width W2, and the width W2 is larger than the width W1. Moreover, the side walls 148, 149, 1411 are at the right angle to the carrier surface 113 of the substrate 110, and, therefore, the openings of the insulating layers 141, 142 and the protection layer 160 form stepped side wall.

Figure 17:
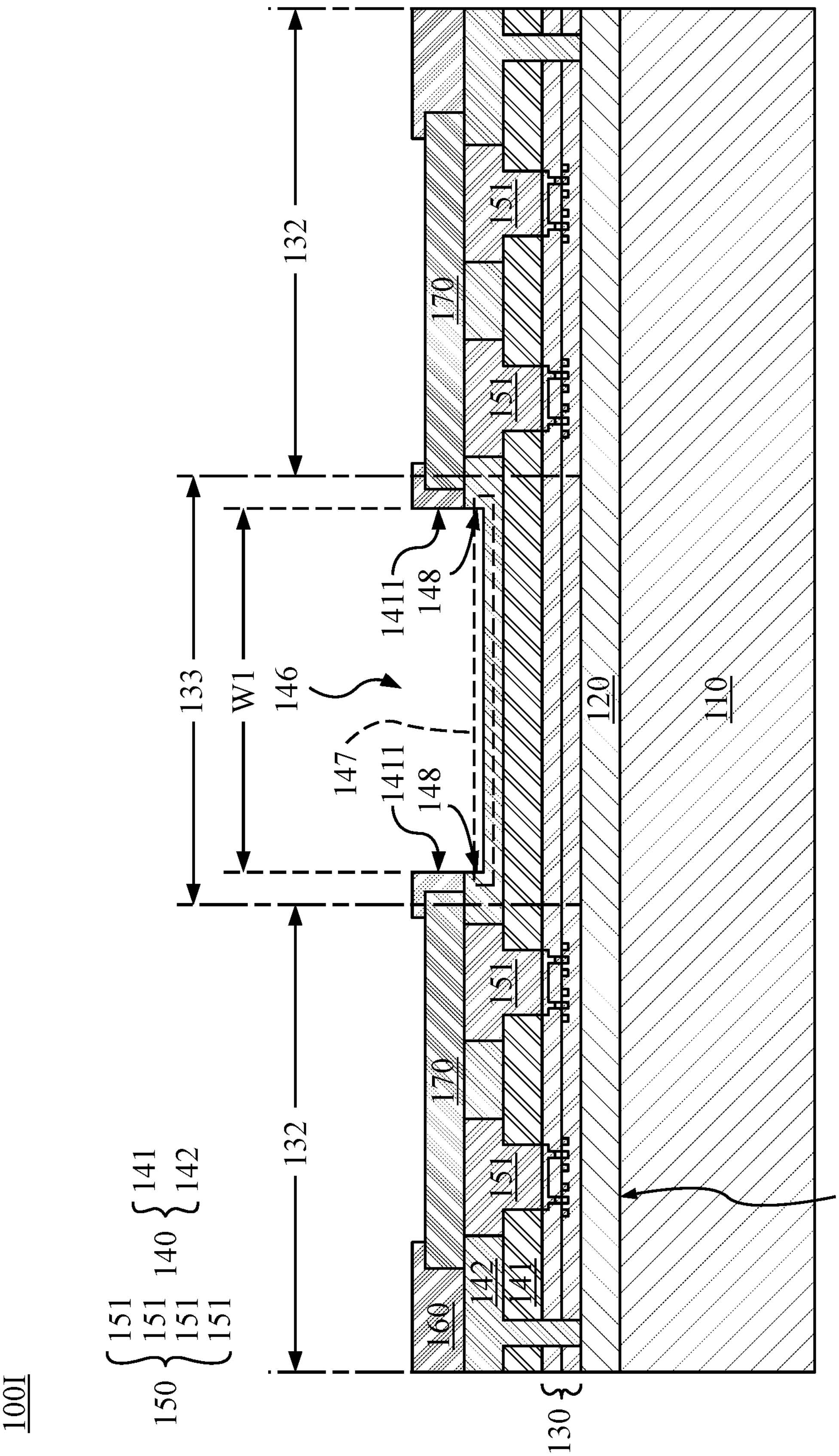
FIG. 17 is a side sectional view of an integrated semiconductor device of some embodiment of the present disclosure.

FIG. 17 is a side sectional view of an integrated semiconductor device 100I of yet another embodiment of the present disclosure. In this embodiment, the insulating layer 142 forms bottom portion 147 of the trench 146.

To be specific, the side wall 148 in the insulating layer 142 and the side wall 1411 in the protection layer 160 are coplanar. The protection layer 160 and the insulating layer 142 collectively form the trench 146 above the isolation portion 133.

The thickness of the conductive pads 170 is less than the deepness of the trench 146, and the height of the circuits 151 and the conductive pads 170 is larger than the deepness of the trench 146.

Figure 18:
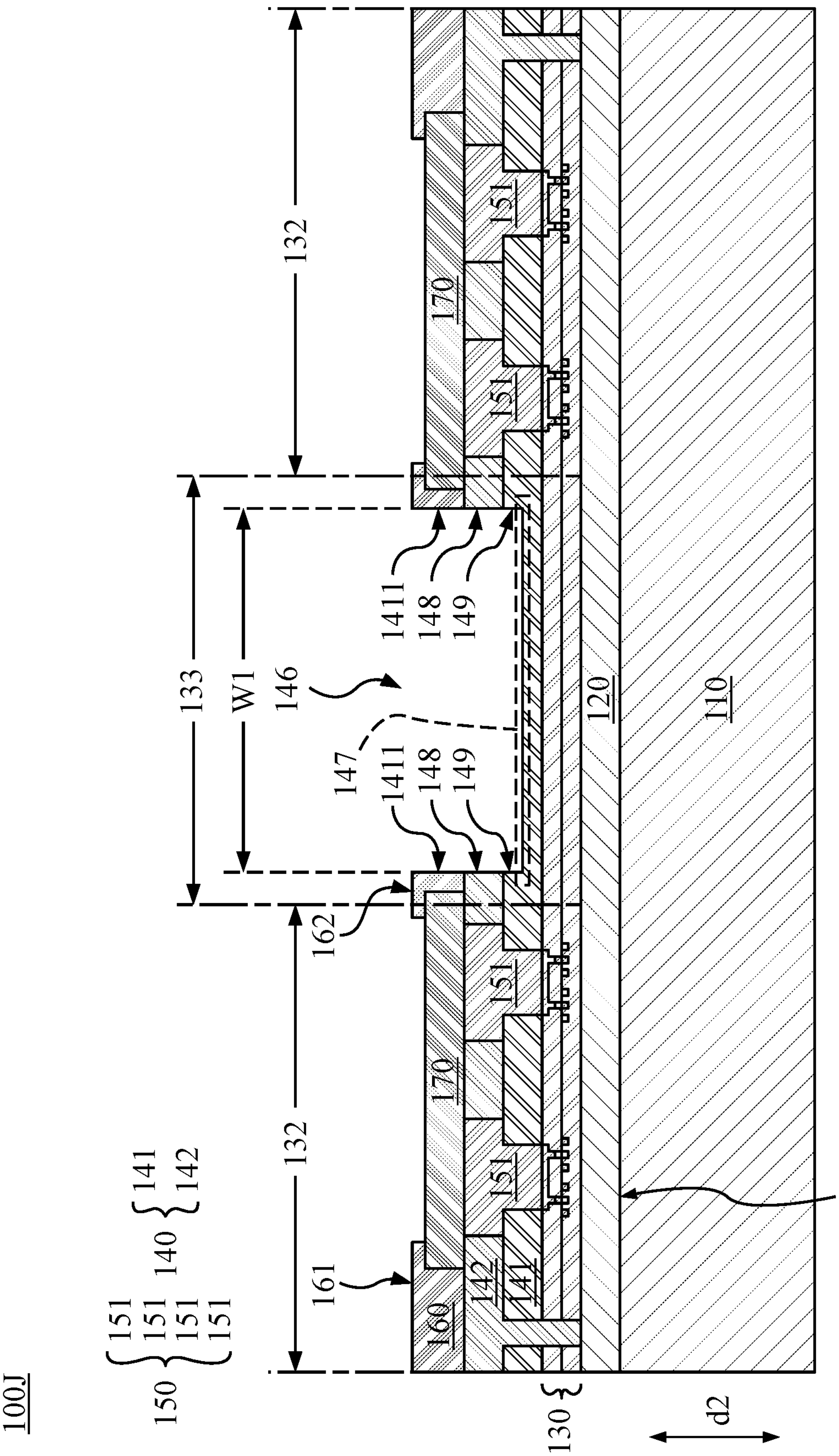
FIG. 18 is a side sectional view of an integrated semiconductor device of some embodiment of the present disclosure.

FIG. 18 is a side sectional view of an integrated semiconductor device 100J of another embodiment of the present disclosure. In this embodiment, the insulating layer 141 forms bottom portion 147 of the trench 146.

To be specific, the side wall 149 in the insulating layer 141, the side wall 148 in the insulating layer 142, and the side wall 1411 in the protection layer 160 are coplanar. The bottom portion 147 is formed by the insulating layer 141, and, therefore, the trench 146 has a rectangular shape.

Referring to top surface 161 of the protection layer 160 on the device portion 132 and top surface 162 of the protection layer 160 on the isolating portion 133, deepness of the opening where the circuits 151 disposed is deeper than deepness of the trench 146.

On the direction d2, which is parallel to the normal of the carrier surface 113 of the substrate 110, the bottom portion 147 of the trench 146 is located between the interface between the insulating layers 141, 142 and the interface between the semiconductor circuit layers 130 and the insulating layer 141.

Figure 19:
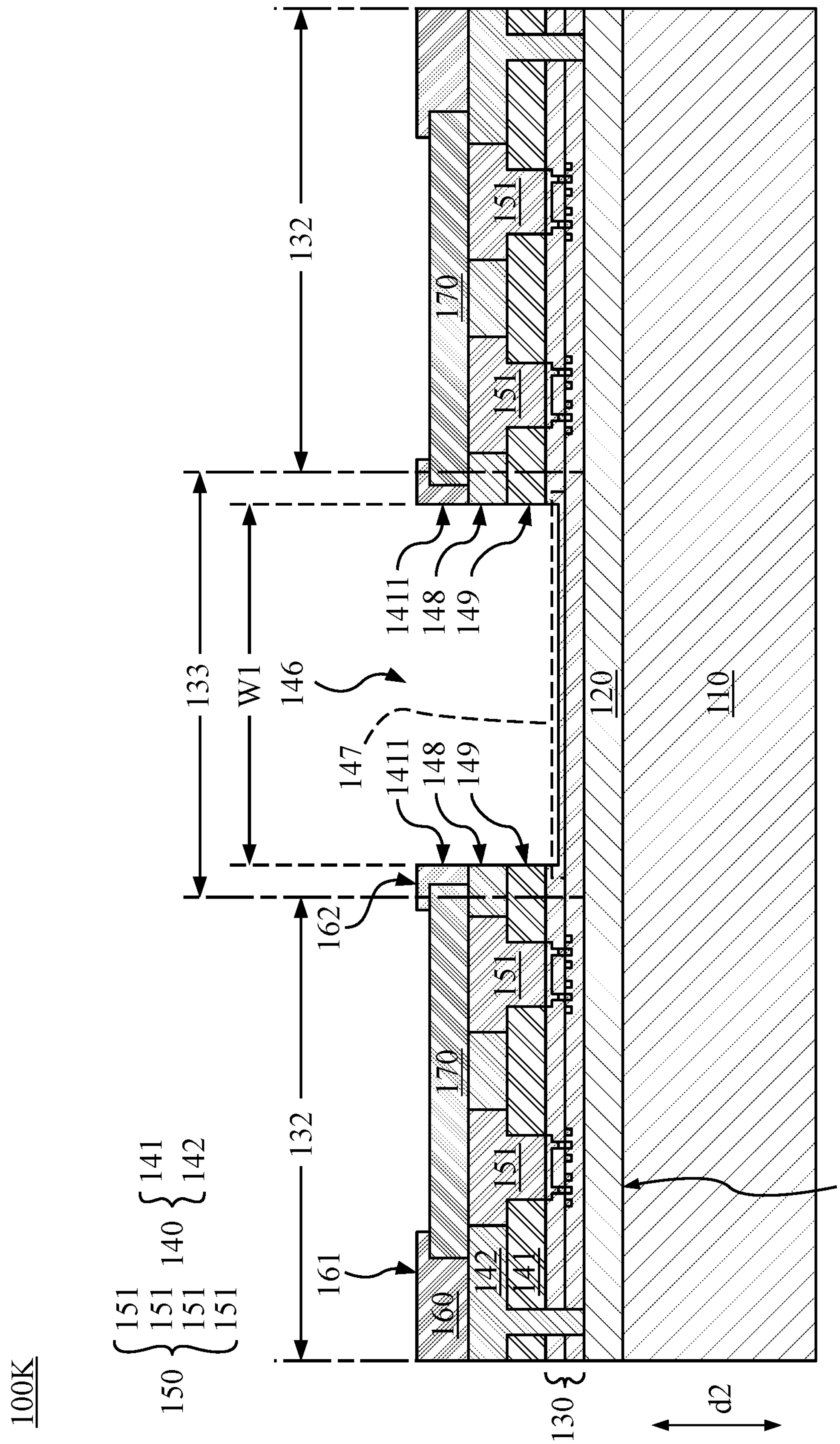
FIG. 19 is a side sectional view of an integrated semiconductor device of some embodiment of the present disclosure.

FIG. 19 is a side sectional view of an integrated semiconductor device 100K of another embodiment of the present disclosure. In this embodiment, the semiconductor circuit layers 130 form the bottom portion 147 of the trench 146.

To be specific, the side wall 149 in the insulating layer 141, the side wall 148 in the insulating layer 142, and the side wall 1411 in the protection layer 160 are coplanar. The trench 146 further extends into the semiconductor circuit layers 130, and the bottom portion 147 is formed by the semiconductor circuit layers 130. In this embodiment, the trench 146 can be formed through one etching process.

Referring to top surface 161 of the protection layer 160 on the device portion 132 and top surface 162 of the protection layer 160 on the isolating portion 133, deepness of the opening where the circuits 151 disposed is shallower than deepness of the trench 146.

On the direction d2, which is parallel to the normal of the carrier surface 113 of the substrate 110, the bottom portion 147 of the trench 146 is located below the interface between the insulating layer 141 and the semiconductor circuit layers 130. The trench 146 may further increased the migration distance between the conductive pads 170.

Figure 20:
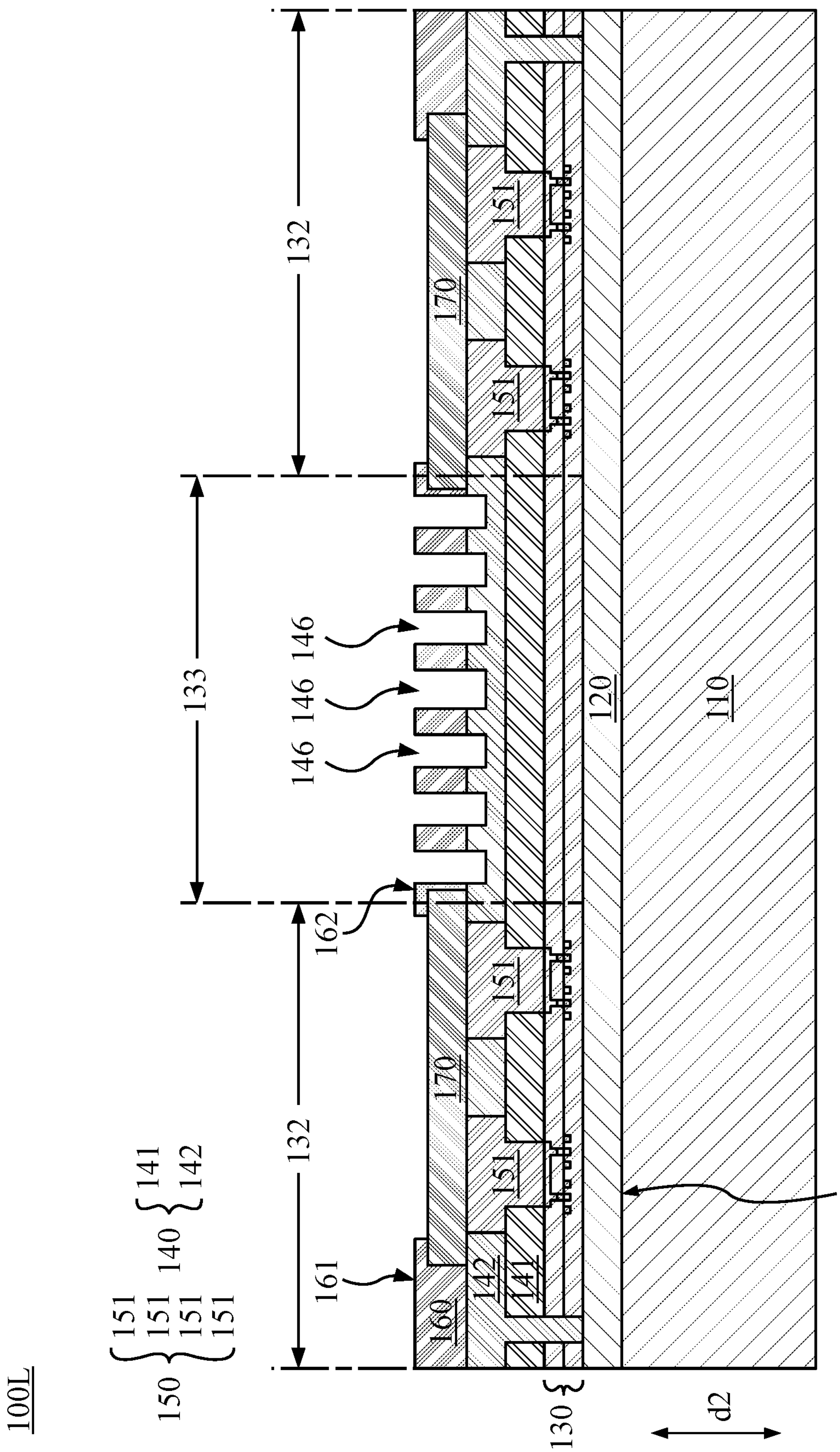
FIG. 20 is a side sectional view of an integrated semiconductor device of some embodiment of the present disclosure.

FIG. 20 is a side sectional view of an integrated semiconductor device 100L of another embodiment of the present disclosure. In this embodiment, the protection layer 160 and the insulating layer 142 form a plurality of columns 1415 above each isolation portion 133. To be specific, the integrated semiconductor device 100L has a tooth cross-section on the insulating portion 133 of the semiconductor circuit layers 130.

To be specific, the integrated semiconductor device 100L of this embodiment has a substrate 110, and an epitaxial layer 120, semiconductor circuit layers 130, insulating layers 141, 142 are disposed on the carrier surface 113 of the substrate 110. interconnection layer 150 having a plurality of circuits 151 are embedded in the insulating material 140, which is formed by the insulating layers 141, 142. Also, a plurality of conductive pads 170 are embedded in the protection layer 160.

In this embodiment, a plurality of trenches 146 are formed in a single isolating portion 133. In the cross-section of the integrated semiconductor device 100L, the contour in the isolating portion 133 is similar to a square wave, and, therefore, the migrating distance between the conductive pads 170 are increased.

Figure 21:
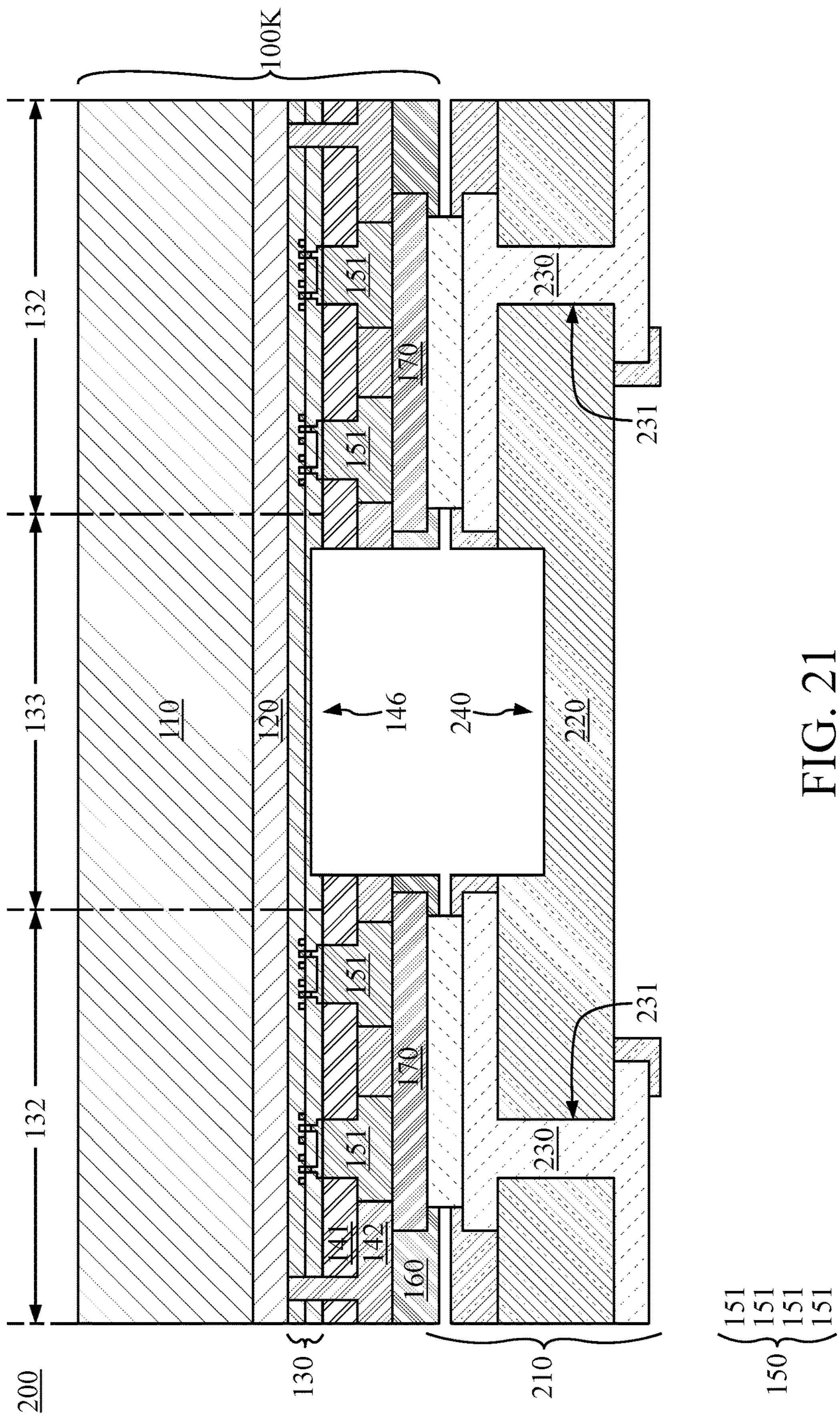
FIG. 21 is a side sectional view of a semiconductor apparatus of some embodiment of the present disclosure.

FIG. 21 is a side sectional view of a semiconductor apparatus 200 of another embodiment of the present disclosure. The semiconductor apparatus 200 has the integrated semiconductor device 100K described above, and a circuit board 210. The circuit board 210 has an insulating board 220 and a plurality of vias 230.

In this embodiment, the circuit board 210 electrically connects the integrated semiconductor device 100K. The insulating board 220 of the circuit board 210 has a plurality of holes 231. The vias 230 are disposed in the holes 231 respectively. The circuit board 210 electrically connects the circuits 151 of the integrated semiconductor device 100K through the vias 230.

Moreover, the insulating board 220 of the circuit board 210 may include an isolating structure 240. The isolating structure 240 is corresponded to the isolating portion 133 of the semiconductor circuit layers 130 of the integrated semiconductor device 100K. However, in other embodiments, the integrated semiconductor device 100K may include a plurality of trenches 146, and the insulating board 220 may have a plurality of isolating structures 240, and the present disclosure is not limited to the numbers of the isolating structures 240 and the trenches 146.

For example, the isolating structure 240 of this embodiment may be a trench, but the present disclosure is not limited thereto.

Figure 22:
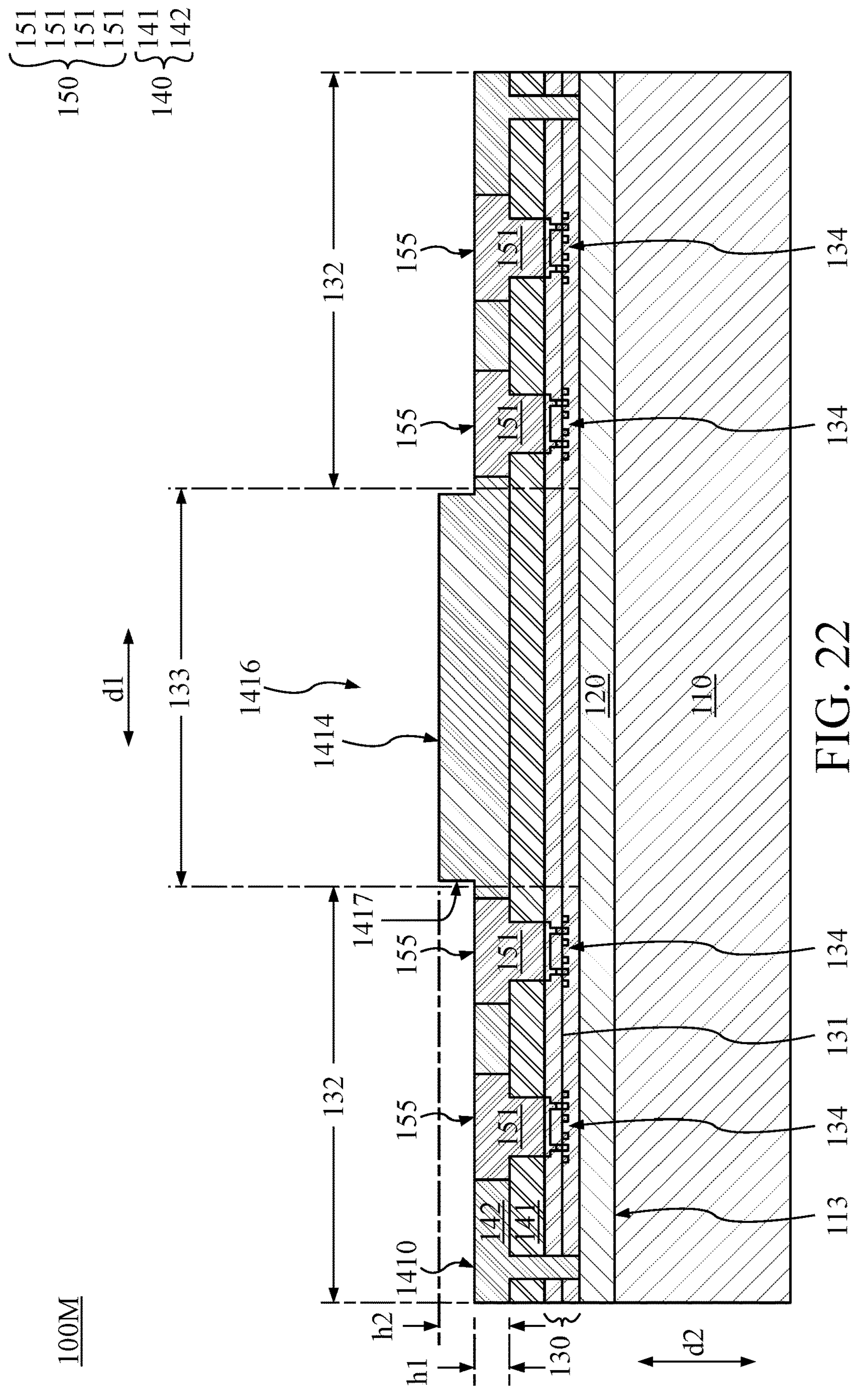
FIG. 22 is a side sectional view of an integrated semiconductor device of some embodiment of the present disclosure.
Figure 23:
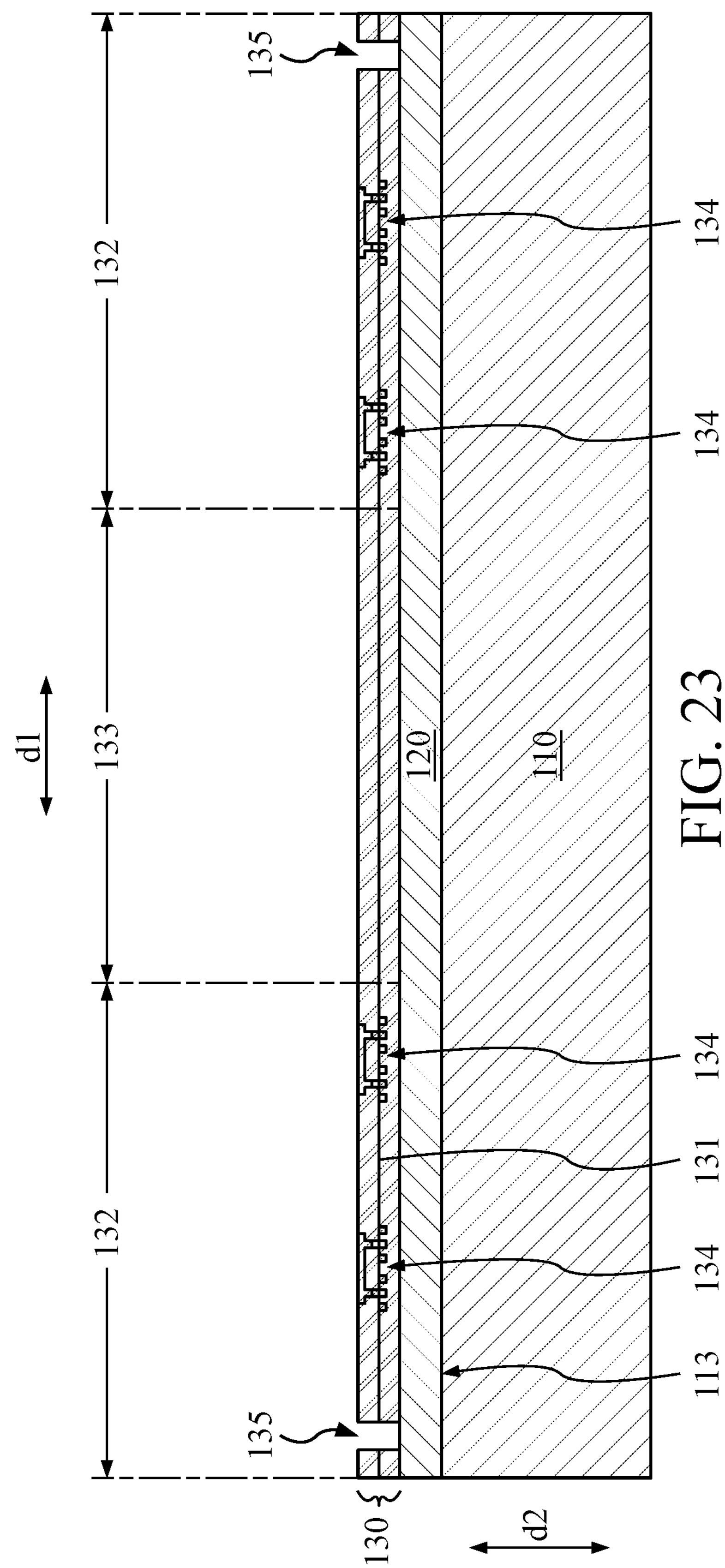
FIGS. 23, 24, 25, 26, and 27 depict steps of a manufacturing method of an integrated semiconductor device according to another embodiment of the present disclosure.

FIG. 22 is a side sectional view of an integrated semiconductor device 100M of another embodiment of the present disclosure. The integrated semiconductor device 100M includes a substrate 110, a plurality of semiconductor circuit layers 130, an insulating material 140, and an interconnection layer 150.

The semiconductor circuit layers 130 has a plurality of device portions 132 and at least one isolating portion 133 disposed among the device portions 132. The isolating portions 133 provide electrical isolation between adjacent said device portions 132.

In the embodiment of the present disclosure, the integrated semiconductor device 100M may include a transistor 134. Furthermore, for example, the integrated semiconductor device 100M may include a field-effect transistor such as high-electron-mobility transistor (HEMT) 134, but the present disclosure is not limited thereto.

The semiconductor circuit layers 130 are disposed above the substrate 110, and some of the semiconductor circuit layers 130 form at least one heterojunction 131. For example, one of the semiconductor circuit layers 130 may include gallium nitride (GaN), and another one may include aluminum gallium nitride (AlGaN), and the heterojunction 131 may form therebetween, and the HEMT 134 may be formed in the semiconductor circuit layers 130.

Furthermore, materials of the semiconductor circuit layers 130 may include III-V semiconductors, and materials of the semiconductor circuit layers 130, which form the heterojunction 131, may include gallium nitride or aluminum gallium nitride. However, the present disclosure is not limited to the materials of the semiconductor circuit layers 130, other material can be included in some embodiments of the present disclosure.

The substrate 110 has a carrier surface 113, and the semiconductor circuit layers 130 are disposed on the carrier surface 113 of the substrate 110, and the insulating material 140 is disposed on the semiconductor circuit layers 130, and the interconnection layer 150 is embedded in the insulating material 140.

In this embodiment, the insulating material 140 formed an isolating structure 1416 on the isolating portion 133, and the isolating structure 1416 is raised from a top surface 1410 of the insulating material 140, and the top surface 1414 of the isolating structure 1416 is higher than the top surface 1410 of the insulating material 140 on the device portion 132.

To be specific, the insulating material 140 has an insulating layer 141 and an insulating layer 142, and the insulating layer 141 is disposed on the semiconductor circuit layers 130, and the insulating layer 142 is disposed on the insulating layer 141.

In this embodiment, the insulating layer 142 on the insulating layer 141 on the device portion 132 has a thickness h1, and the insulating layer 142 on the isolating portion 133 has a thickness h2, and the thickness h2 is larger than the thickness h1.

To be specific, the thickness h2 is the highest thickness of the insulating layer 142 on the isolating portion 133. Therefore, the electrical migration distance between the circuits 151 in different device portions 132 can be further increased, and electrical migration can be further prevented.

For example, a ratio of the thickness h2 to the thickness h1 is ranged from 1.5 to 3. However, the present disclosure is not limited thereto.

In this embodiment, the top surface 1414 on the isolating portion 133 is a flat plane, and the top surface 1410 of the insulating material 140 on the device portion 132 and the top surfaces 155 of the circuits 151 are coplanar. The isolating structure 1416 is a raised platform, and, therefore, the insulating material 140 on the isolating portion 133 can provide proper electrical isolation between the circuits 151 on different device portions 132.

The side wall 1417 of the isolating structure 1416 is extending along direction d2, which is parallel to the carrier surface 113 of the substrate 110.

Moreover, an epitaxial layer 120 may be disposed on the substrate 110, and the semiconductor circuit layers 130 may be disposed on the epitaxial layer 120.

FIGS. 23, 24, 25, 26, and 27 are side sectional views depicting a manufacturing method of the integrated semiconductor device 100N of an embodiment of the present disclosure. Please refer to FIG. 23, the manufacturing method provides a substrate 110 and a plurality of semiconductor circuit layers 130. Some of the semiconductor circuit layers 130 form heterojunction 131. For example, one of the semiconductor circuit layers 130 may contain GaN, and another one of the semiconductor circuit layers 130 may contain AlGaN, and the heterojunction 131 is formed therebetween.

Also, a plurality of transistors 134 are formed in the semiconductor circuit layers 130. For example, the semiconductor circuit layers 130 form the sources, drains, and the gates of the transistors 134. Moreover, separating openings 135 can be form in the semiconductor circuit layers 130 through etching.

In this embodiment, the transistors 134 are distributed in the device portions 132 of the semiconductor circuit layers 130, and no transistors 134 is disposed in the isolating portion 133 of the semiconductor circuit layers 130. Therefore, the isolating portions 133 are positioned among the device portions 132 to electrically insulate device portions 132 from one another.

Figure 24:
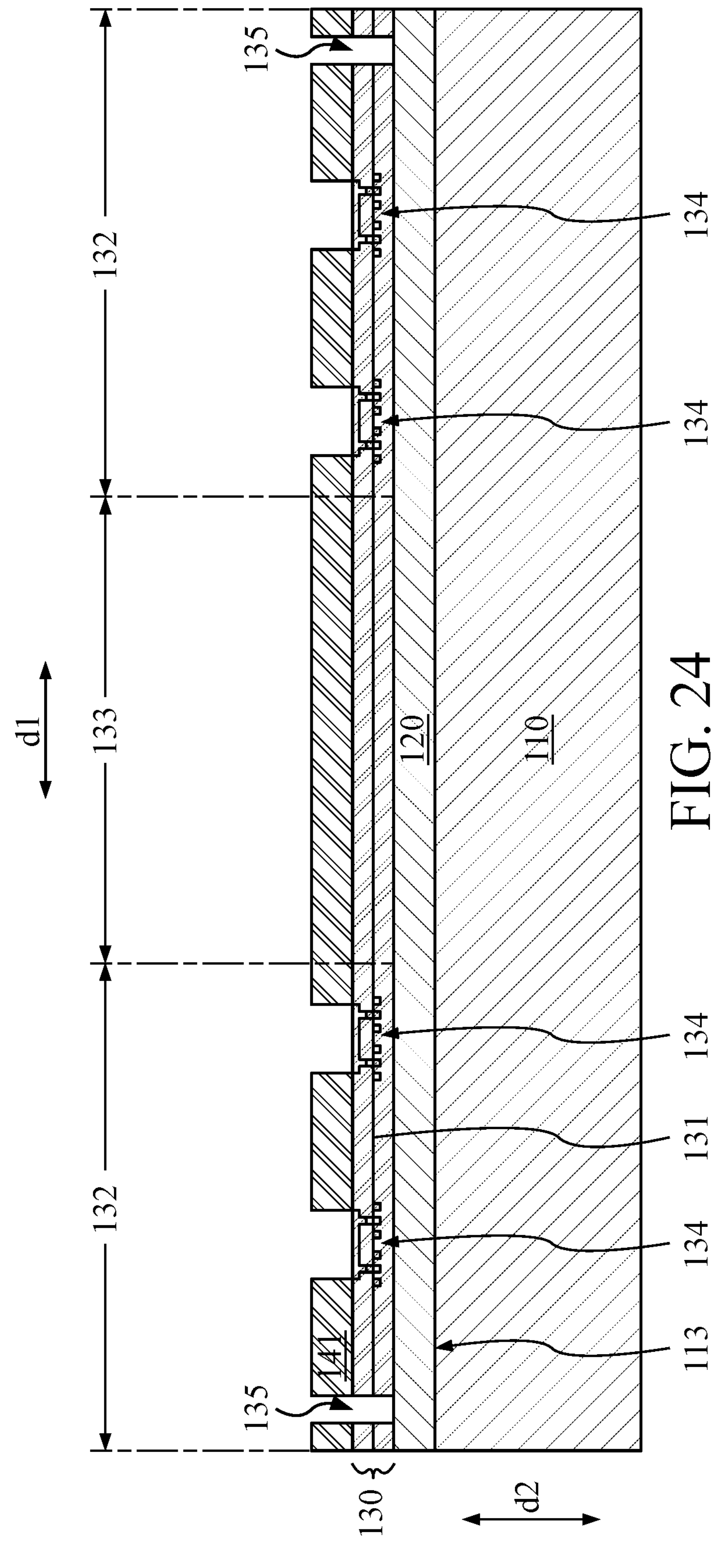

Referring to FIG. 24, the manufacturing method provides an insulating layer 141 on the semiconductor circuit layers 130. To be specific, the insulating layer 141 may exposes the transistors 134 and the separating openings 135 of the semiconductor circuit layers 130.

Figure 25:
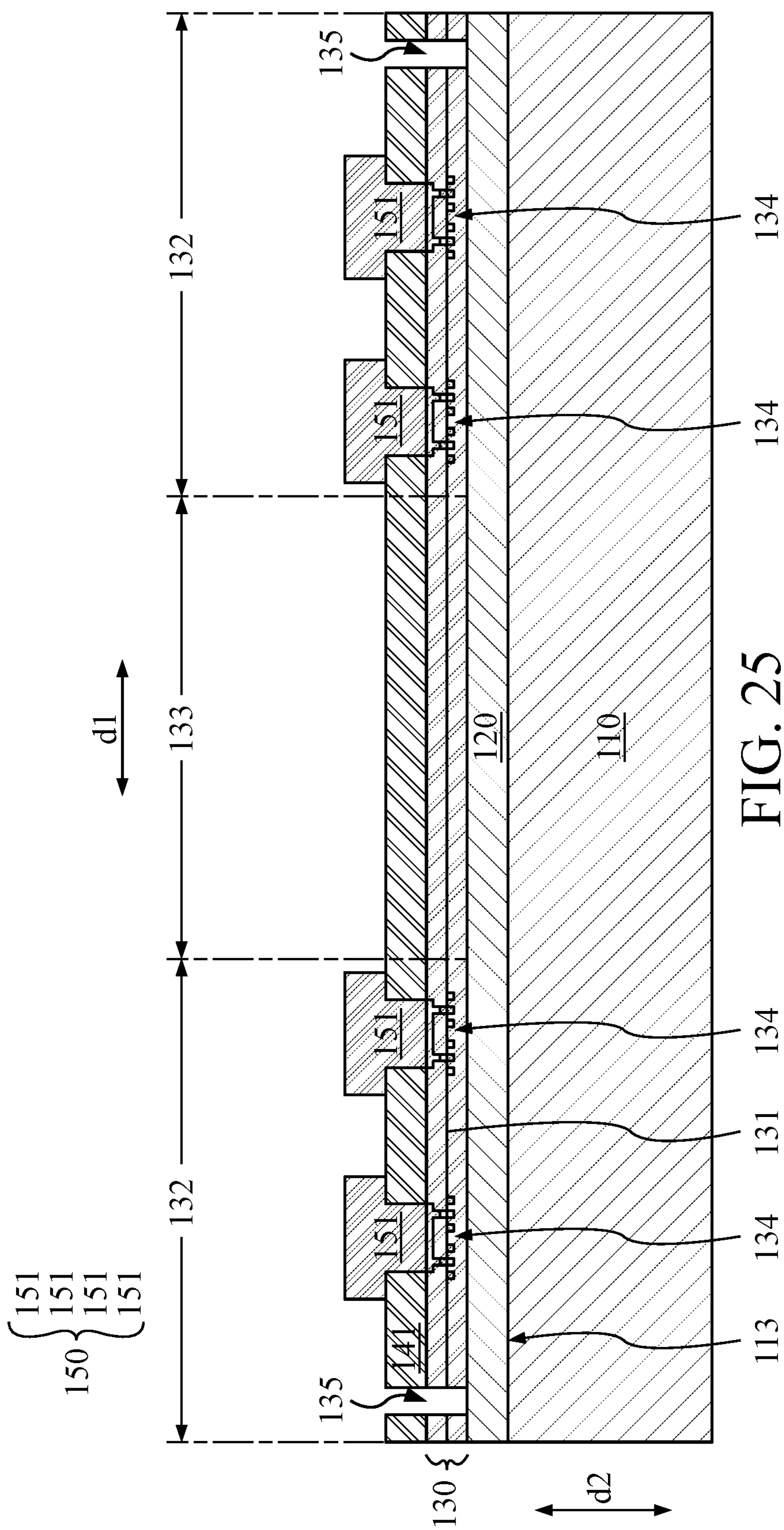

Referring to FIG. 25, the manufacturing method providing an interconnection layer 150 on the insulating layer 141. The interconnection layer 150 has a plurality of circuits 151, and the circuits 151 electrically connect the transistors 134 respectively.

Figure 26:
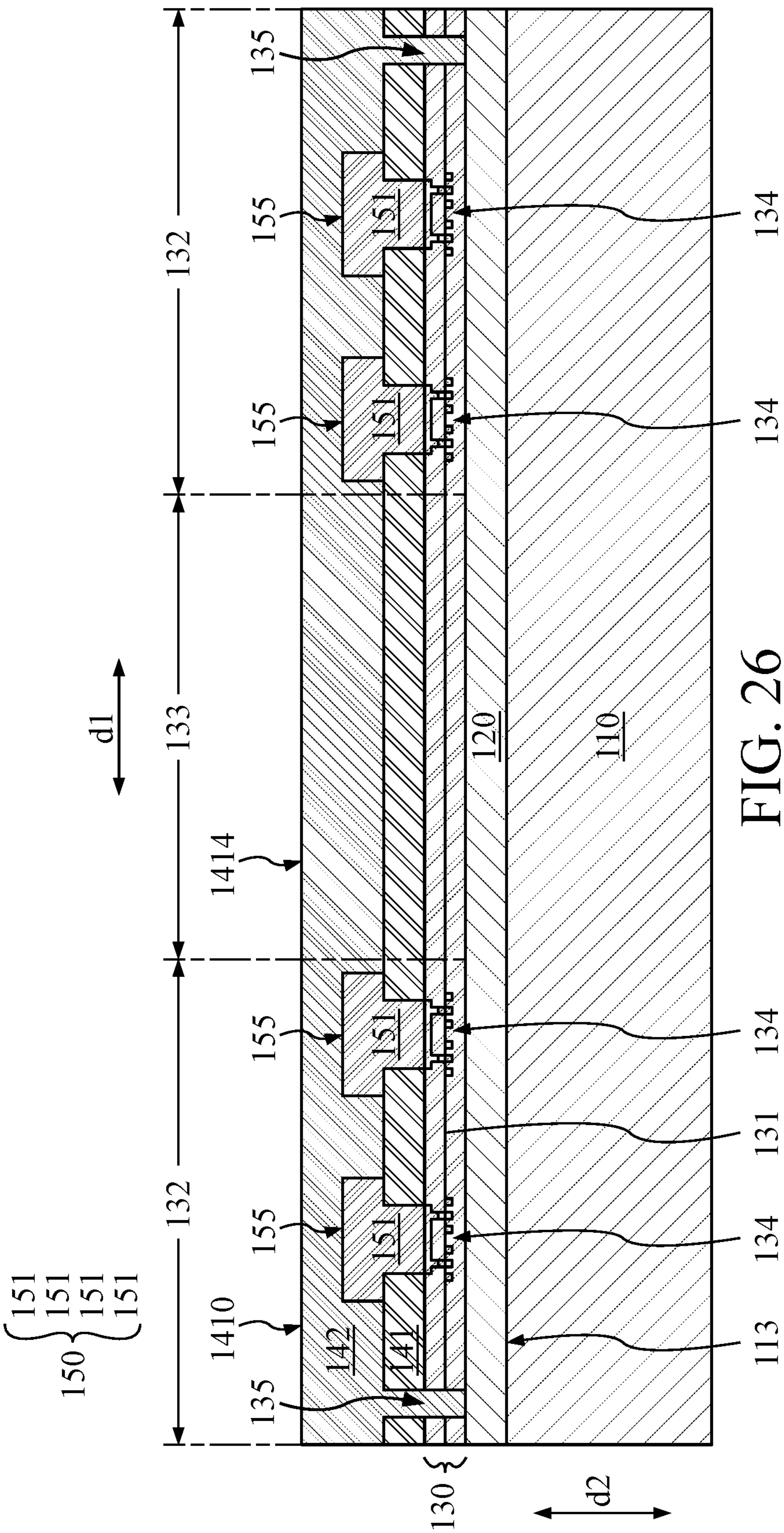

Referring to FIG. 26, the manufacturing method providing an insulating layer 142 on the insulating layer 141. The manufacturing method fills the opening 135 with the insulating layer 142, and the insulating layer 142 covers the top surfaces 155 of the circuits 151.

In this embodiment, a top surface 1410 of the insulating layer 142 on the device portion 132 and a top surface 1414 of the insulating layer 142 on the isolating portion 133 are coplanar and located higher than the top surfaces 155 of the circuits 151 of the interconnection layer 150.

Figure 27:
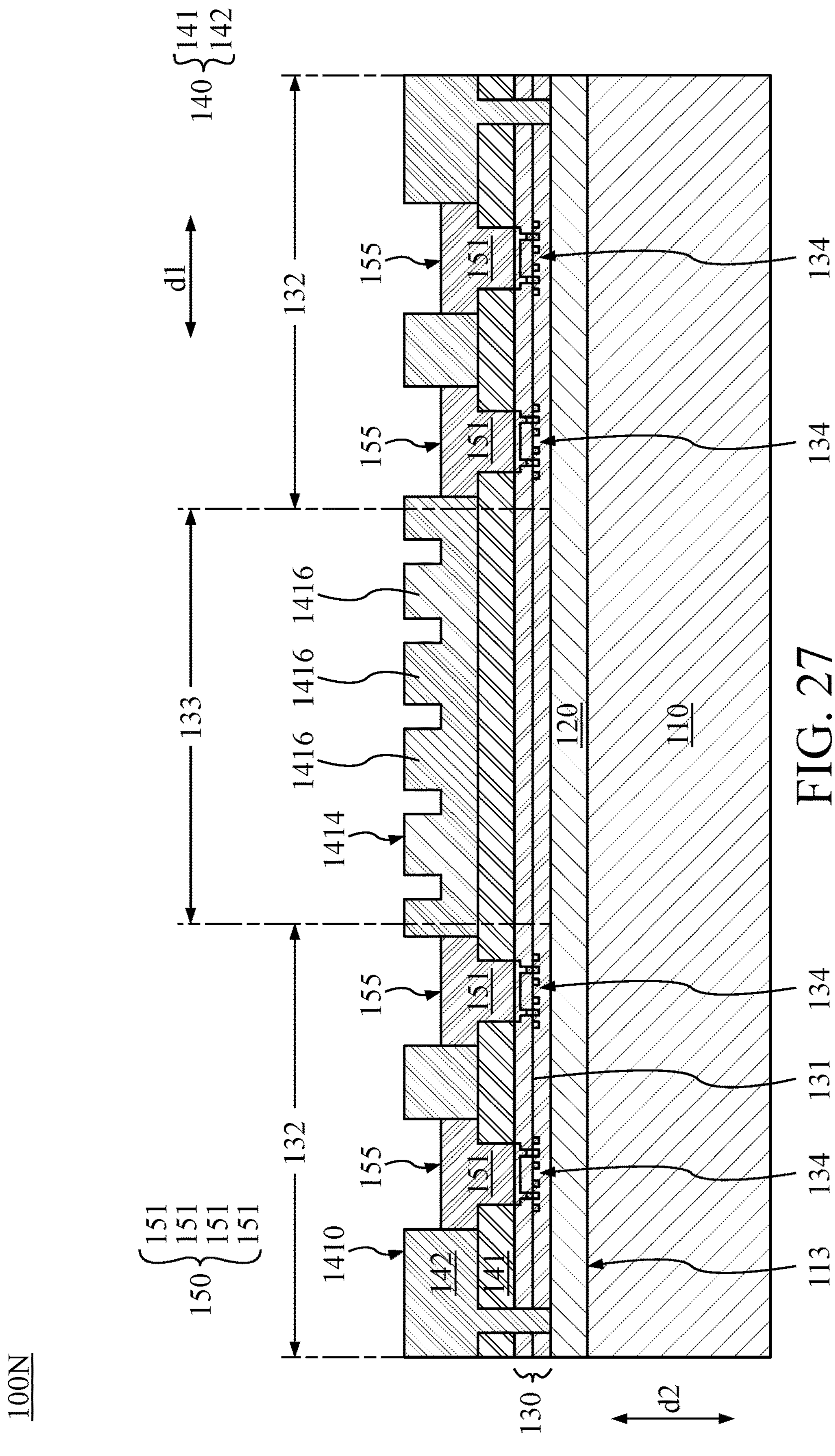

Referring to FIG. 27, the manufacturing method forming isolating structures 1416 on the isolating portions 133 of the semiconductor circuit layers 131. Moreover, the circuits 151 are exposed through etching process. The isolating structures 1416 are raised from top surfaces 155 of circuits 151 of the interconnection layer 150.

Also, the isolating layer 141 and the isolating layer 142 form the insulating material 140. The isolating structures 1416 are formed in the insulating material 140. The isolating structures 1416 formed a toothed contour, and electrical migration distance between the circuits 151 in different device portions 132 are increased, and the electrical migration can be prevented.

Moreover, the top surfaces 155 of the circuits 151 lower than the top surface 1410 of the insulating material 140 on the device portion 132. Therefore, the insulating material 140 may also increase electrical migration distance between the circuits 151.

Figure 28:
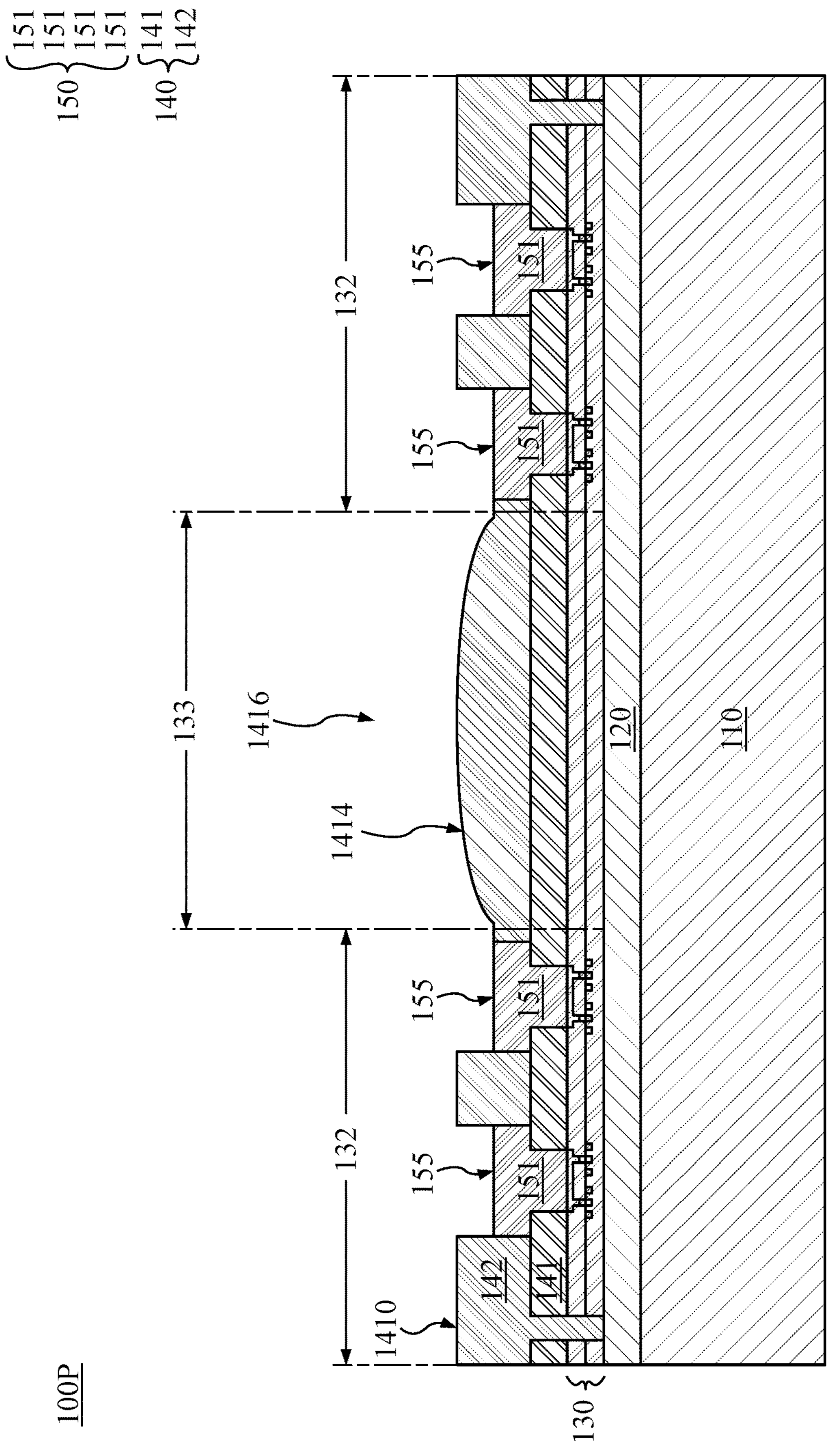
FIG. 28 is a side sectional view of an integrated semiconductor device of some embodiment of the present disclosure.

FIG. 28 is a side sectional view of an integrated semiconductor device 100P of another embodiment of the present disclosure. The integrated semiconductor device 100P is similar to the integrated semiconductor device 100M. The integrated semiconductor device 100P has a substrate 110, an epitaxial layer 120, semiconductor circuit layers 130, an insulating material 140, and an interconnection layer 150. The insulating material 140 has an insulating layer 141 and an insulating layer 142. The interconnection layer 150 has a plurality of circuits 151.

The integrated semiconductor device 100P has an isolating structure 1416, and the isolating structure 1416 is raised from the top surfaces 155 of the circuits 151, and the isolating structure 1416 has a rounded top surface 1414.

Figure 29:
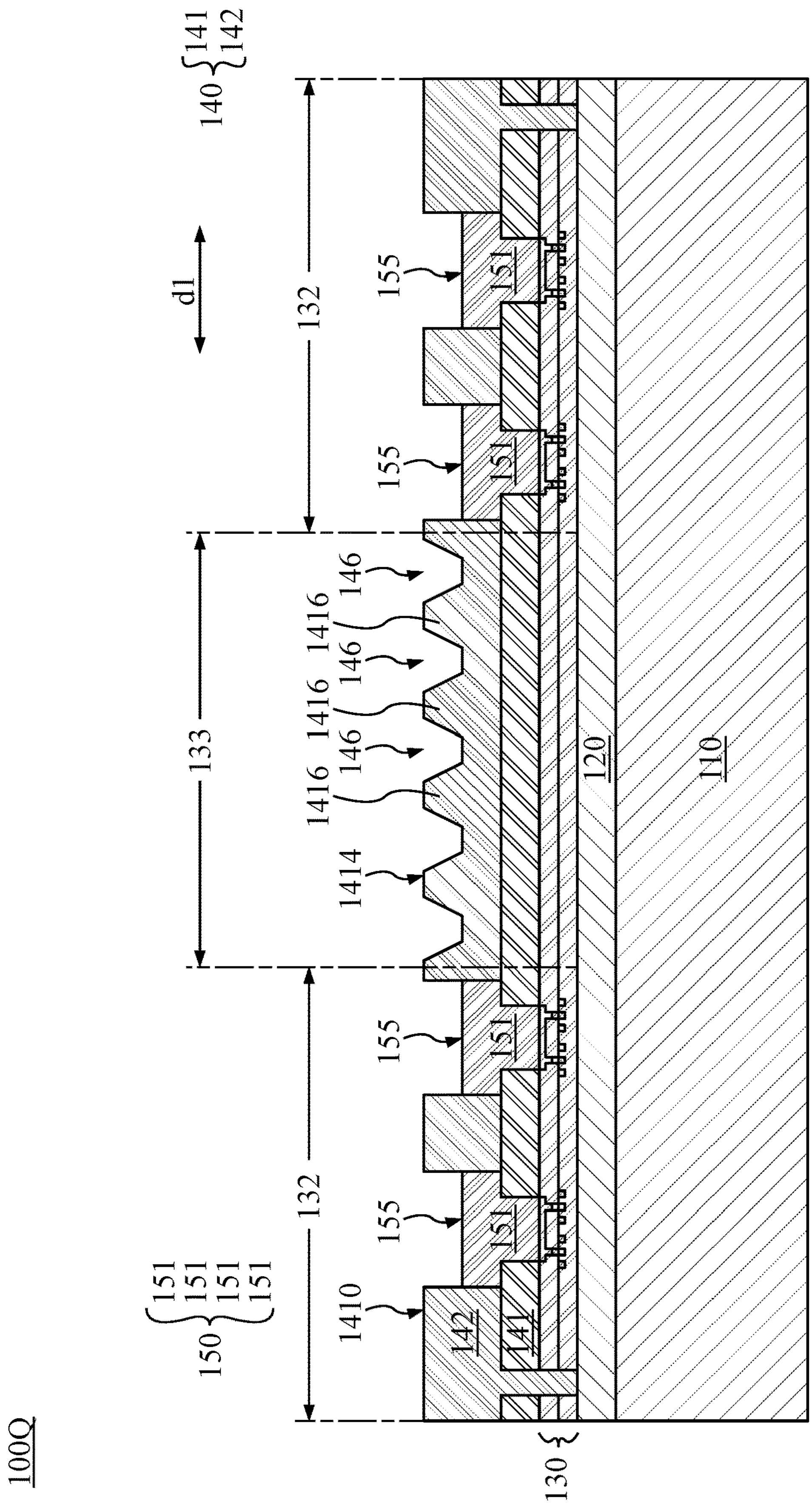
FIG. 29 is a side sectional view of an integrated semiconductor device of some embodiment of the present disclosure.

FIG. 29 is a side sectional view of an integrated semiconductor device 100Q of another embodiment of the present disclosure. The integrated semiconductor device 100Q is similar to the integrated semiconductor device 100N. The integrated semiconductor device 100Q has a substrate 110, an epitaxial layer 120, semiconductor circuit layers 130, an insulating material 140, and an interconnection layer 150. The insulating material 140 has an insulating layer 141 and an insulating layer 142. The interconnection layer 150 has a plurality of circuits 151.

On the isolating portion 133, the insulating material 140 form a plurality of isolating structures 1416. The shape of the cross-section of the isolating structure 1416 is a trapezoid. The cross-section of the isolating structure 1416 have an approximately trapezoidal shape.

Moreover, a plurality of trenches 146 are formed among the isolating structures 1416, and the shape of the cross-section of the trenches 146 is a trapezoid. The cross-section of the trench 146 has an approximately trapezoidal shape.

Figure 30:
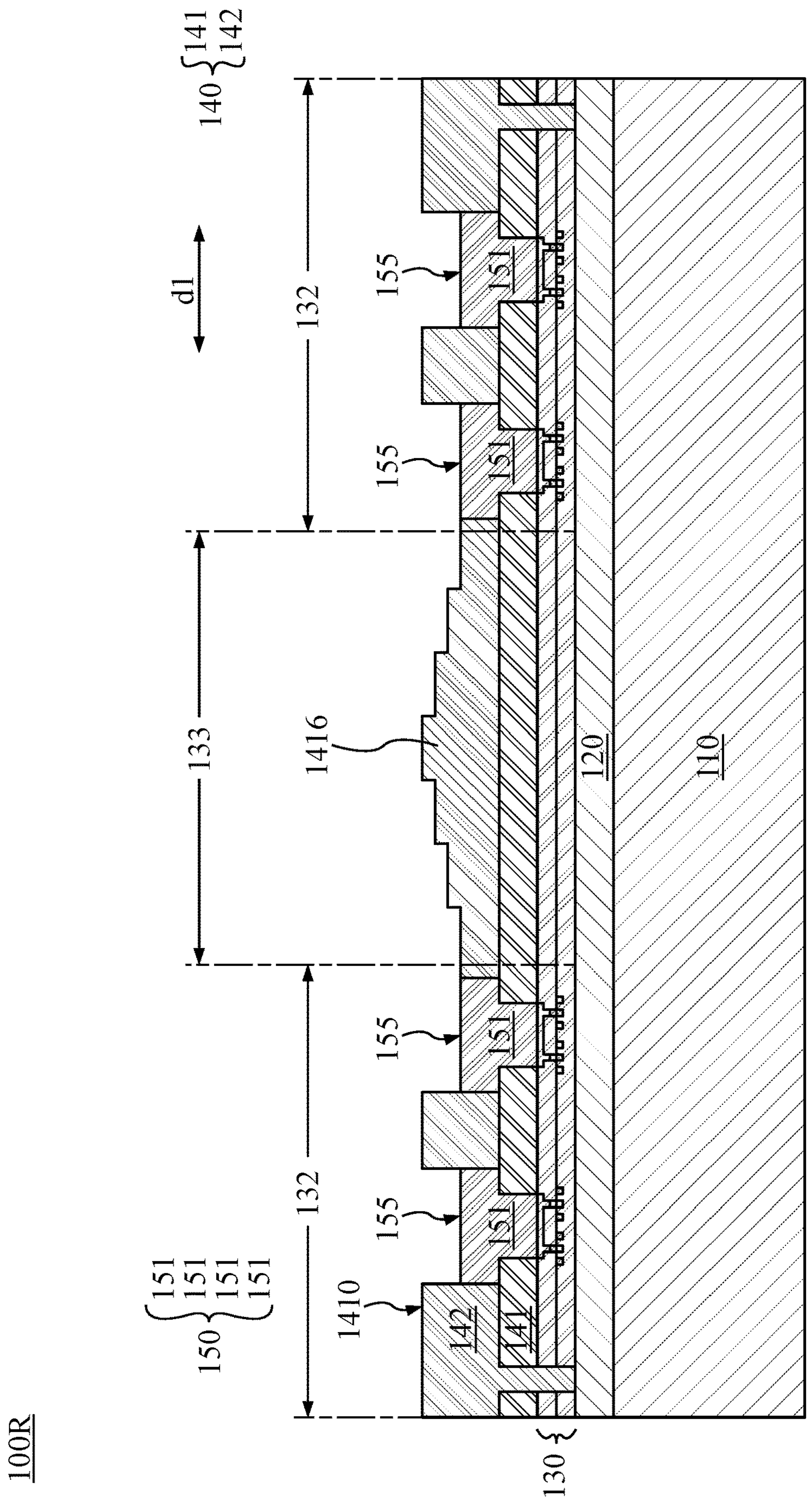
FIG. 30 is a side sectional view of an integrated semiconductor device of some embodiment of the present disclosure.

FIG. 30 is a side sectional view of an integrated semiconductor device 100R of another embodiment of the present disclosure. The integrated semiconductor device 100R is similar to the integrated semiconductor device 100N. The integrated semiconductor device 100R has a substrate 110, an epitaxial layer 120, semiconductor circuit layers 130, an insulating material 140, and an interconnection layer 150. The insulating material 140 has an insulating layer 141 and an insulating layer 142. The interconnection layer 150 has a plurality of circuits 151.

On the isolating portion 133 of the semiconductor circuit layers 130, the isolating structure 1416 is raised from the top surfaces 155 of the circuits 151.

In this embodiment, the isolating structure 1416 has a stepped outline. Moreover, thickness of the isolating structure 1416 is increasing towards the center of the isolating portion 133, and electrical migration can be further prevented.

The invention claimed is:

1. An integrated semiconductor device, comprising:
- a substrate;
- a plurality of semiconductor circuit layers disposed above the substrate and having a plurality of device portions and one or more isolating portions located among the device portions, the isolating portions providing electrical isolation between adjacent said device portions;
- a first insulating layer disposed on the semiconductor circuit layers;
- a second insulating layer disposed on the first insulating layer; and
- an interconnection layer disposed on the semiconductor circuit layers and penetrating the first and second insulating layers to electrically connect the device portions;

wherein some of the semiconductor circuit layers form at least one heterojunction, and the second insulating layer or the first and second insulating layers collectively form one or more trenches above each isolating portion of the semiconductor circuit layers, and the interconnection layer has a plurality of first circuits located above the device portions.

2. The integrated semiconductor device of claim 1, wherein each trench includes side walls and the side walls of the trenches have continuous profiles.

3. The integrated semiconductor device of claim 1, wherein a width of the trench is decreasing towards a bottom portion of the trench in the first insulating layer.

4. The integrated semiconductor device of claim 1, wherein a width of the trench is increasing towards a bottom portion of the trench in the first insulating layer.

5. The integrated semiconductor device of claim 1, wherein the first insulating layer and the second insulating layer collectively form a stepped sidewall over the isolating portions, and a width of the trench in the first insulating layer is smaller than a width of the trench in the second insulating layer.

6. The integrated semiconductor device of claim 1, wherein at least one of the isolating portions is exposed from the corresponding one of the trenches.

7. The integrated semiconductor device of claim 1, wherein the first insulating layer forms bottom portions of the trenches.

8. The integrated semiconductor device of claim 1, wherein the first circuits have a first portion within the first insulating layer and a second portion within the second insulating layer and wider than the first portion, and an interface between the first circuit and the second insulating layer and a side wall of the trench in the second insulating layer are parallel.

9. The integrated semiconductor device of claim 1, further comprising:
- a protection layer; and
- a plurality of conductive pads disposed on the second insulating layer and the interconnection layer with the protection layer, wherein the protection layer and the second insulating layer or the protection layer and the first and second insulating layers collectively form the trenches above the isolating portion.

10. The integrated semiconductor device of claim 9, wherein the second insulating layer forms bottom portions of the trenches.

11. The integrated semiconductor device of claim 9, wherein the protection layer and the second insulating layer form a plurality of columns above each isolation portion.

12. The integrated semiconductor device of claim 9, wherein the projections of two of the conductive pads and the trench therebetween on a carrier surface of the substrate has aligned top sides and bottom sides.

13. The integrated semiconductor device of claim 1, wherein the trenches have a rectangular shape viewed along a normal vector of a carrier surface of the substrate.

14. The integrated semiconductor device of claim 1, wherein materials of the semiconductor circuit layers include III-V semiconductors, and materials of the semiconductor circuit layers form the heterojunction include gallium nitride.

15. A semiconductor apparatus, comprising:
- at least one integrated semiconductor device of claim 1; and
- a circuit board electrically connecting the integrated semiconductor device and comprising:
  - an insulating board having a plurality of holes; and
  - a plurality of vias disposed in the holes respectively, wherein the circuit board electrically connects the first circuits of the integrated semiconductor device through the vias.

16. The semiconductor apparatus of claim 15, wherein the insulating board of the circuit board comprises one or more isolating structures corresponding to the isolating portions of the semiconductor circuit layers of the integrated semiconductor device.

17. A manufacturing method of an integrated semiconductor device, comprising:
- providing substrate and semiconductor circuit layers disposed thereon;
- providing a first insulating layer on the semiconductor circuit layers;
- providing an interconnection layer on device portions of the semiconductor circuit layers;
- providing a second insulating layer on the first insulating layer; and
- forming one or more trenches above isolating portions of the semiconductor circuit layers, wherein the isolating portions are positioned among the device portions to electrically insulate device portions from one another.

18. The manufacturing method of claim 17, wherein the formation of the trenches creates wider openings in the first insulating layer and narrower openings in the second insulating layer.

19. The manufacturing method of claim 17, wherein the formation of the trenches creates narrower openings in the first insulating layer and wider openings in the second insulating layer.

20. The manufacturing method of claim 17, wherein the formation of the trenches creates openings in the first insulating layer having the same width as openings in the second insulating layer.

* * * * *